(12) United States Patent
Nishikawa et al.

(10) Patent No.: US 7,153,767 B2
(45) Date of Patent: Dec. 26, 2006

(54) CHEMICAL MECHANICAL POLISHING STOPPER FILM, PROCESS FOR PRODUCING THE SAME, AND METHOD OF CHEMICAL MECHANICAL POLISHING

(75) Inventors: Michinori Nishikawa, Ibaraki (JP); Takashi Okada, Ibaraki (JP); Kinji Yamada, Ibaraki (JP)

(73) Assignee: JSR Corporation, Tokyo (JP)

( * ) Notice: Subject to any disclaimer, the term of this patent is extended or adjusted under 35 U.S.C. 154(b) by 71 days.

(21) Appl. No.: 10/902,008

(22) Filed: Jul. 30, 2004

(65) Prior Publication Data
US 2005/0003218 A1 Jan. 6, 2005

Related U.S. Application Data

(62) Division of application No. 09/938,589, filed on Aug. 27, 2001, now abandoned.

(30) Foreign Application Priority Data
Aug. 28, 2000 (JP) .............................. 2000-257536

(51) Int. Cl.
*H01L 21/302* (2006.01)
(52) U.S. Cl. ...................... 438/634; 438/633; 438/692; 438/693
(58) Field of Classification Search ................ 438/691, 438/692, 693, 627, 643, 634, 633
See application file for complete search history.

(56) References Cited

U.S. PATENT DOCUMENTS

| 5,976,979 A | 11/1999 | Chen | |
|---|---|---|---|
| 6,342,448 B1 * | 1/2002 | Lin et al. | 438/687 |
| 6,383,933 B1 * | 5/2002 | Shu et al. | 438/692 |
| 6,452,251 B1 * | 9/2002 | Bernstein et al. | 257/532 |
| 6,593,239 B1 * | 7/2003 | Kaufman et al. | 438/692 |

FOREIGN PATENT DOCUMENTS

| WO | WO 96/28491 | 9/1996 |
|---|---|---|
| WO | WO 98/33836 | 8/1998 |
| WO | WO 00/49647 | 8/2000 |

OTHER PUBLICATIONS

U.S. Appl. No. 10/102,710, filed Mar. 22, 2002, Shinohara et al.

* cited by examiner

*Primary Examiner*—Lan Vinh
(74) *Attorney, Agent, or Firm*—Oblon, Spivak, McClelland, Maier & Neustadt, P.C.

(57) ABSTRACT

A chemical mechanical polishing stopper film comprising at least one organic polymer, said film having a dielectric constant of 4 or lower, and a chemical mechanical polishing method. The chemical mechanical polishing method comprises forming a chemical mechanical polishing stopper film comprising at least one organic polymer on an insulating film so that the stopper film is interposed between the insulating film and a metal film to be removed by chemical mechanical polishing, and then removing the metal film with a chemical mechanical polishing slurry.

4 Claims, 1 Drawing Sheet

CMP TREATMENT

CHEMICAL MECHANICAL POLISHING STOPPER FILM, PROCESS FOR PRODUCING THE SAME, AND METHOD OF CHEMICAL MECHANICAL POLISHING

This is a divisional application of U.S. application Ser. No. 09/938,589, filed Aug. 27, 2001 now abandoned.

FIELD OF THE INVENTION

The present invention relates to a chemical mechanical polishing stopper film. More particularly, the invention relates to a stopper film for use in semiconductor device production for preventing interlayer dielectrics made of $SiO_2$, a fluorine-doped $SiO_2$, an organic/inorganic SOG (spin-on-glass) material, or the like from being damaged by the chemical mechanical polishing (hereinafter often referred to as "CMP") of wafers on which a wiring pattern has been formed.

DESCRIPTION OF THE RELATED ART

Aqueous dispersions of inorganic particles, such as colloidal silica and colloidal alumina, have conventionally been used frequently as abrasive materials for the CMP of metal wirings, barrier films, and the like in semiconductor device production. However, the CMP treatment with these aqueous dispersions has a problem that interlayer dielectrics are apt to be scratched or peel off.

SUMMARY OF THE INVENTION

An object of the invention, which eliminates the above-described problem of the conventional technique, is to diminish the damage of an interlayer dielectrics by CMP by forming a specific coating film as a layer overlying the interlayer dielectric.

The invention provides a chemical mechanical polishing stopper film which comprises at least one organic polymer and has a dielectric constant of 4 or lower.

BRIEF DESCRIPTION OF THE DRAWING

The Figure shows an embodiment of an application of the invention, in which a metal film has been formed (a), and the structure shown by (b) is obtained by removing unnecessary part of metals.

Figure 1:
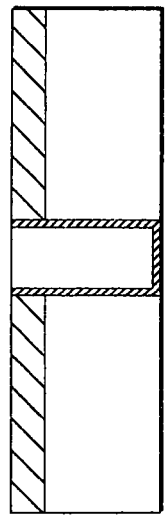
Figure 1:
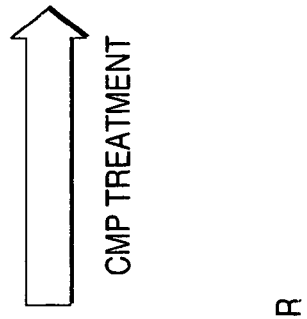
Figure 1:
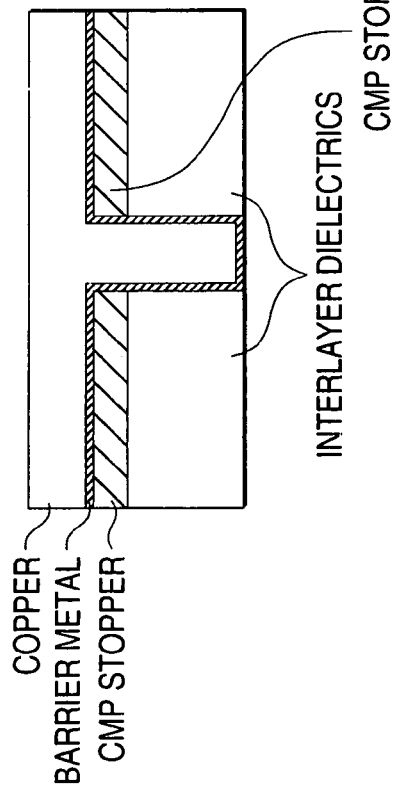

DETAILED DESCRIPTION OF THE INVENTION (A) Organic Polymer

The chemical mechanical polishing stopper film of the invention comprises at least one organic polymer having a dielectric constant of 4 or lower.

Examples of the organic polymer include aromatic polymers having a dielectric constant of 4 or lower, preferably 3.5 or lower, and a carbon content of 60% by weight or higher, preferably 70% by weight or higher.

In particular, this organic polymer preferably is a combination of an aromatic polyarylene and an aromatic poly (arylene ether) or is either of these. Preferred examples of these polymers include a polymer having repeating structural units represented by the following general formula (1) (polymer (1)), a polymer having repeating structural units represented by the following general formula (2) (polymer (2)), and a polymer having repeating structural units represented by general formula (36) (polymer (3)).

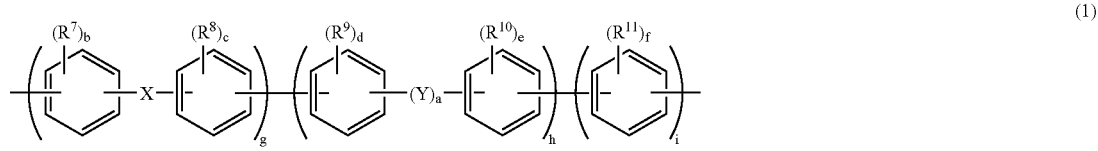

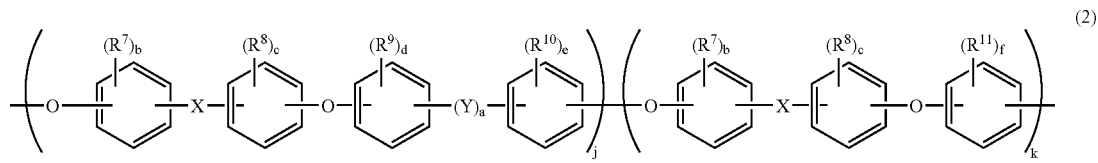

In general formulae (1) and (2), $R^7$ to $R^{11}$ each independently represent a hydrocarbon group having 1 to 20 carbon atoms, a cyano group, a nitro group, an alkoxyl group having 1 to 20 carbon atoms, an aryl group, or a halogen atom; X is at least one member selected from the group consisting of groups represented by —CQQ'— (wherein Q and Q' may be the same or different and each represent a halogenoalkyl group, an alkyl group, a hydrogen atom, a halogen atom, or an aryl group) and a fluorenylene group; Y is at least one member selected from the group consisting of —O—, —CO—, —COO—, —CONH—, —S—, —SO_2—, and a phenylene group; a is 0 or 1; b to f each are an integer of 0 to 4; g is 5 to 100 mol %; h is 0 to 95 mol %; i is 0 to 95 mol % (provided that g+h+i=100 mol %); j is 0 to 100 mol %; and k is 0 to 100 mol % (provided that j+k=100 mol %).

The polymer (1) and polymer (2) which may be contained in or constitute ingredient (A) preferably contain hydrocarbon groups having 1 to 20 carbon atoms from the standpoint of obtaining a coating film having improved heat resistance.

In the polymer (1) and polymer (2), repeating structural units are preferably linked in the para-positions to X, from the standpoint of obtaining a polymer having a high molecular weight.

  (36)

wherein $Y_1$ represents a bivalent organic group represented by the following formula (37) or (38); Ar represents a bivalent organic group; and n represents 0 or 1;

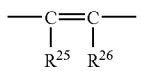  (37)

wherein $R^{25}$ and $R^{26}$ may be the same or different, are located in the cis positions, and each represents a hydrogen atom, an alkyl group, or an aryl group;

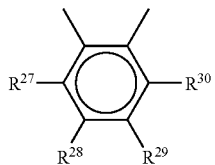  (38)

wherein $R^{27}$ to $R^{30}$ may be the same or different and each represents a hydrogen atom, a fluorine atom, an alkyl group, a halogenated alkyl group or an aryl group.

Polymer (1):

The polymer represented by formula (1) can be produced, for example, by polymerizing one or more monomers comprising a compound represented by the following formula (3) in the presence of a catalyst system containing a transition metal compound.

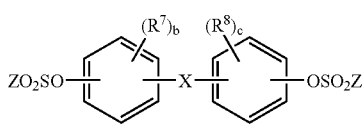  (3)

In formula (3), $R^7$ and $R^8$ each independently represent a hydrocarbon group having 1 to 20 carbon atoms, a cyano group, a nitro group, an alkoxyl group having 1 to 20 carbon atoms, an aryl group, or a halogen atom; X is at least one member selected from the group consisting of groups represented by —CQQ'- (wherein Q and Q' may be the same or different and each represent a halogenoalkyl group, an alkyl group, a hydrogen atom, a halogen atom, or an aryl group) and a fluorenylene group; b and c each are an integer of 0 to 4; and Z represents an alkyl group, a halogenoalkyl group, or an aryl group.

Specific examples of Q and Q' which may be contained in X in general formula (3) are as follows. Examples of the alkyl group include methyl, ethyl, isopropyl, n-propyl, butyl, pentyl, and hexyl; examples of the halogenoalkyl group include trifluoromethyl and pentafluoroethyl; examples of the arylalkyl group include benzyl and diphenylmethyl; and examples of the aryl group include phenyl, biphenyl, tolyl, and pentafluorophenyl.

Specific examples of Z contained in —$OSO_2Z$ in formula (3) are as follows. Examples of the alkyl group include methyl and ethyl; examples of the halogenoalkyl group include trifluoromethyl and pentafluoroethyl; and examples of the aryl group include phenyl, biphenyl, p-tolyl, and p-pentafluorophenyl.

Preferred examples of X in general formula (3) include the bivalent groups represented by the following formulae (4) to (9).

More preferred of these is the fluorenylene group represented by formula (9).

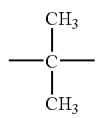  (4)

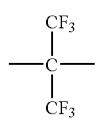  (5)

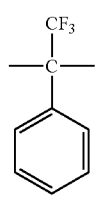  (6)

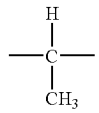  (7)

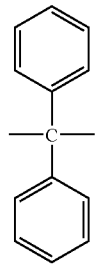  (8)

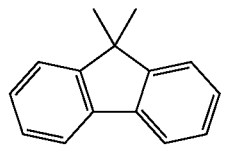  (9)

Specific examples of the compound (monomer) represented by general formula (3) include
2,2-bis(4-methylsulfonyloxyphenyl)hexafluoropropane,
bis(4-methylsulfonyloxyphenyl)methane,
bis(4-methylsulfonyloxyphenyl)diphenylmethane,
2,2-bis(4-methylsulfonyloxy-3-methylphenyl)hexafluoropropane, 2,2-bis(4-methylsulfonyloxy-3-propenylphenyl)hexafluoropropane,
2,2-bis(4-methylsulfonyloxy-3,5-dimethylphenyl)hexafluoropropane,
2,2-bis(4-methylsulfonyloxyphenyl)propane,
2,2-bis(4-methylsulfonyloxy-3-methylphenyl)propane,
2,2-bis(4-methylsulfonyloxy-3-propenylphenyl)propane,
2,2-bis(4-methylsulfonyloxy-3,5-dimethylphenyl)propane,
2,2-bis(4-methylsulfonyloxy-3-fluorophenyl)propane,
2,2-bis(4-methylsulfonyloxy-3,5-difluorophenyl)propane,
2,2-bis(4-trifluoromethylsulfonyloxyphenyl)propane,
2,2-bis(4-trifluoromethylsulfonyloxy-3-propenylphenyl)propane,
2,2-bis(4-phenylsulfonyloxyphenyl)propane,
2,2-bis(4-phenylsulfonyloxy-3-methylphenyl)propane,
2,2-bis(4-phenylsulfonyloxy-3-propenylphenyl)propane,
2,2-bis(4-phenylsulfonyloxy-3,5-dimethylphenyl)propane,
2,2-bis(4-phenylsulfonyloxy-3-fluorophenyl)diphenylmethane,
2,2-bis(p-tolylsulfonyloxyphenyl)propane,
2,2-bis(p-tolylsulfonyloxy-3-methylphenyl)propane,
2,2-bis(p-tolylsulfonyloxy-3-propenylphenyl)propane,
2,2-bis(p-tolylsulfonyloxy-3,5-dimethylphenyl)propane,
2,2-bis(p-tolylsulfonyloxy-3-methylphenyl)propane,
2,2-bis(p-tolylsulfonyloxy-3,5-dimethylphenyl)propane,
2,2-bis(p-tolylsulfonyloxy-3-propenylphenyl)propane,
bis(p-tolylsulfonyloxy-3-fluorophenyl)propane,
bis(p-tolylsulfonyloxy-3,5-difluorophenyl)propane,
9,9-bis(4-methylsulfonyloxyphenyl)fluorene,
9,9-bis(4-methylsulfonyloxy-3-methylphenyl)fluorene,
9,9-bis(4-methylsulfonyloxy-3,5-dimethylphenyl)fluorene,
9,9-bis(4-methylsulfonyloxy-3-propenylphenyl)fluorene,
9,9-bis(4-methylsulfonyloxy-3-phenylphenyl)fluorene,
bis(4-methylsulfonyloxy-3-methylphenyl)diphenylmethane,
bis(4-methylsulfonyloxy-3,5-dimethylphenyl)diphenylmethane,
bis(4-methylsulfonyloxy-3-propenylphenyl)diphenylmethane,
bis(4-methylsulfonyloxy-3-fluorophenyl)diphenylmethane,
bis(4-methylsulfonyloxy-3,5-difluorophenyl)diphenylmethane,
9,9-bis(4-methylsulfonyloxy-3-fluorophenyl)fluorene,
9,9-bis(4-methylsulfonyloxy-3,5-difluorophenyl)fluorene,
bis(4-methylsulfonyloxyphenyl)methane,
bis(4-methylsulfonyloxy-3-methylphenyl)methane,
bis(4-methylsufonyloxy-3,5-dimethylphenyl)methane,
bis(4-methylsulfonylosy-3-propenylphenyl)methane,
bis(4-methylsulfonyloxyphenyl)trifluoromethylphenylmethane,
bis(4-methylsufonyloxyphenyl)phenylmethane,
2,2-bis(4-trifluoromethylsufonyloxyphenyl)hexafluoropropane,
bis(4-trifluoromethylsufonyloxyphenyl)methane,
bis(4-trifluoromethylsulfonyloxyphenyl)diphenylmethane,
2,2-bis(4-trifluoromethylsulfonyloxy-3-methylphenyl)hexafluoropropane,
2,2-bis(4-trifluoromethylsulfonyloxy-3-propenyl-phenyl)hexafluoropropane,
2,2-bis(4-trifluoromethylsulfonyloxy-3,5-dimethylphenyl)hexafluoropropane,
9,9-bis(4-trifluoromethylsulfonyloxyphenyl)fluorene,
9,9-bis(4-trifluoromethylsulfonyloxy-3-methylphenyl)fluorene,
9,9-bis(4-trifluoromethylsulfonyloxy-3,5-dimethylphenyl)fluorene,
9,9-bis(4-trifluoromethylsulfonyloxy-3-propenylphenyl)fluorene,
9,9-bis(4-trifluoromethylsulfonyloxy-3-phenylphenyl)fluorene,
bis(4-trifluoromethylsulfonyloxy-3-methylphenyl)diphenylmethane,
bis(4-trifluoromethylsufonyloxy-3,5-dimethylphenyl)diphenylmethane,
bis (4-trifluoromethylsulfonyloxy-3-propenylphenyl)diphenylmethane,
bis(4-trifluoromethylsulfolyloxy-3-fluorophenyl)diphenylmethane,
bis(4-trifluoromethylsulfonyloxy-3,5-difluorophenyl)diphenylmethane,
9,9-bis(4-trifluoromethylsulfonyloxy-3-fluorophenyl)-fluorene,
9,9-bis(4-trifluoromethylsulfonyloxy-3,5-difluorophenyl)fluorene,
bis(4-trifluoromethylsulfonyloxyphenyl)methane,
bis(4-trifluoromethylsulfonyloxy-3-methylphenyl)methane,
bis(4-trifluoromethylsulfonyloxy-3,5-dimethylphenyl)methane,
bis(4-trifluoromethylsulfonyloxy-3-propenylphenyl)methane,
bis(4-trifluoromethylsulfonyloxyphenyl)trifluoromethylphenylmethane,
bis(4-trifluoromethylsulfonyloxyphenyl),
2,2-bis(4-phenylsulfonyloxyphenyl)hexafluoropropane,
bis(4-phenylsulfonyloxyphenyl)methane,
bis(4-phenylsulfonyloxyphenyl)diphenylmethane,
2,2-bis(4-phenylsulfonyloxy-3-methylphenyl)hexafluoropropane,
2,2-bis(4-phenylsulfonyloxy-3-propenylphenyl)hexafluoropropane,
2,2-bis(4-phenylsulfonyloxy-3,5-dimethylphenyl)hexafluoropropane,
9,9-bis(4-phenylsulfonyloxyphenyl)fluorene,
9,9-bis(4-phenylsulfonyloxy-3-methylphenyl)fluorene,
9,9-bis(4-phenylsulfonyloxy-3,5-dimethylphenyl)fluorene,
9,9-bis(4-phenylsulfonyloxy-3-propenylphenyl)fluorene,
9,9-bis(4-phenylsulfonyloxy-3-phenylphenyl)fluorene,
bis(4-phenylsulfonyloxy-3-methylphenyl)diphenylmethane,
bis(4-phenylsulfonyloxy-3,5-dimethylphenyl)diphenylmethane,
bis(4-phenylsulfonyloxy-3-propenylphenyl)diphenylmethane,
bis(4-phenylsulfonyloxy-3-fluorophenyl)diphenylmethane,
bis(4-phenylsulfonyloxy-3,5-difluorophenyl)diphenylmethane,
9,9-bis(4-phenylsulfonyloxy-3-fluorophenyl)fluorene,
9,9-bis(4-phenylsulfonyloxy-3,5-difluorophenyl)fluorene,
bis(4-phenylsulfonyloxyphenyl)methane,
bis(4-phenylsulfonyloxy-3-methylphenyl)methane,
bis(4-phenylsulfonyloxy-3,5-dimethylphenyl)methane,
bis(4-phenylsulfonyloxy-3-propenylphenyl)methane,
bis(4-phenylsulfonyloxyphenyl)trifluoromethylphenylmethane,
bis(4-phenylsulfonyloxyphenyl)phenylmethane,
2,2-bis(p-tolylsulfonyloxyphenyl)hexafluoropropane,
bis(p-tolylsulfonyloxyphenyl)methane,
bis(p-tolylsulfonyloxyphenyl)diphenylmethane,
2,2-bis(p-tolylsulfonyloxy-3-methylphenyl)hexafluoropropane,
2,2-bis(p-tolylsulfonyloxy-3-propenylphenyl)hexafluoropropane,
2,2-bis(p-tolylsulfonyloxy-3,5-dimethylphenyl)hexafluoropropane, 9,9-bis(p-tolylsulfonyloxyphenyl)fluorene,
9,9-bis(p-tolylsulfonyloxy-3-methylphenyl)fluorene,
9,9-bis(p-tolylsulfonyloxy-3,5-dimethylphenyl)fluorene,
9,9-bis(p-tolylsulfonyloxy-3-propenylphenyl)fluorene,
9,9-bis(p-tolylsulfonyloxy-3-phenylphenyl)fluorene,
bis(p-tolylsulfonyloxy-3-methylphenyl)diphenylmethane,
bis(p-tolylsulfonylony-3,5-dimethylphenyl)diphenylmethane,
bis(p-tolylsulfonyloxy-3-propenylphenyl)diphenylmethane,
bis(p-tolylsulfonyloxy-3-fluorophenyl)diphenylmethane,
bis(p-tolylsulfonyloxy-3,5-difluorophenyl)diphenylmethane,
9,9-bis(p-tolylsulfonyloxy-3-fluorophenyl)fluorene,
9,9-bis(p-tolylsulfonyloxy-3,5-difluorophenyl)fluorene,
bis(p-tolylsulfonyloxyphenyl)methane,
bis(p-tolylsulfonyloxy-3-methylphenyl)methane,
bis(p-tolylsulfonyloxy-3,5-dimethylphenyl)methane,
bis(p-tolylsulfonyloxy-3-propenylphenyl)methane,
bis(p-tolylsulfonyloxyphenyl)trifluoromethylphenylmethane, and
bis(p-tolylsulfonyloxyphenyl)phenylmethane.

In the invention, two or more compounds represented by general formula (3) can be copolymerized.

The compounds represented by general formula (3) can be synthesized, for example, by the following processes.

First, a bisphenol compound (e.g., 2,2-bis(4-hydroxyphenyl)hexafluoropropane) and a base are dissolved in a solvent, the amount of the base being at least two equivalents to the bisphenol compound. Pyridine or the like may be used as this solvent so as to function as both a solvent and a base. A catalyst such as, e.g., 4-dimethylaminopyridine may be added according to need.

Subsequently, a sulfonyl chloride (anhydride) (e.g., methanesulfonyl chloride) is dropped into the solution in a dry nitrogen stream over 5 to 60 minutes, while keeping the solution at 15° C. or lower. The resultant mixture is stirred at that temperature for from 0 to 60 minutes and then at room temperature for from 0 to 24 hours to prepare a suspension. The suspension obtained is poured into a 3- to 20-fold amount of ice water to cause reprecipitation, and the precipitate is recovered. This precipitate is repeatedly subjected to an operation such as recrystallization. Thus, a bissulfonate compound can be obtained as crystals.

Alternatively, a bisphenol compound (e.g., 2,2-bis(4-hydroxyphenyl)hexafluoropropane) is first dissolved in an aqueous solution of two equivalents of an alkali, e.g., sodium hydroxide. On the other hand, a sulfonyl chloride (anhydride) (e.g., methanesulfonyl chloride) is dissolved in an organic solvent such as toluene or chloroform. Subsequently, a phase-transfer catalyst such as acetyltrimethylammonium chloride is added to these solutions according to need, and a mixture of the solutions is vigorously agitated. Therefore, the organic layer obtained through the reaction is purified. By this method also, the target bissulfonate compound can be obtained.

In the invention, at least one compound represented by general formula (3) may be copolymerized with at least one member selected from the group consisting of compounds represented by the following general formulae (10) and (11).

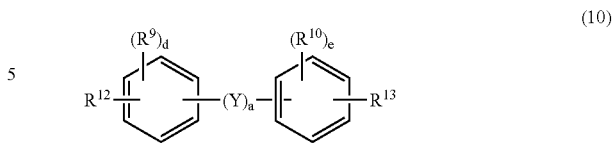

In general formula (10), $R^9$ and $R^{10}$ each independently represent an alkyl group having 1 to 20 carbon atoms, an halogenated alkyl group, a cyano group, a nitro group, an alkoxyl group having 1 to 20 carbon atoms, an allyl group, an aryl group, a halogen atom or —OSO$_2$Z; $R^{12}$ and $R^{13}$ each represent —OSO$_2$Z (wherein Z represents an alkyl group, a halogenoalkyl group, or an aryl group), a chlorine atom, a bromine atom, or an iodine atom; Y represents at least one member selected from the group consisting of —O—, —CO—, —COO—, —CONH—, —S—, —SO$_2$—, and a phenylene group; a Is 0 or 1; and d and e each are an integer of 0 to 4.

Specific examples of $R^9$ and $R^{10}$ are as follows. Examples of the halogen atom include fluorine. Examples of the monovalent organic groups include alkyl groups such as methyl and ethyl, halogenoalkyl groups such as trifluoromethyl and pentafluoroethyl, allyl groups such as propenyl, and aryl groups such as phenyl and pentafluorophenyl. Examples of Z contained in —OSO$_2$Z include alkyl groups such as methyl and ethyl, halogenoalkyl groups such as trifluoromethyl, and aryl groups such as phenyl, p-tolyl, and p-fluorophenyl.

Examples of the compounds represented by general formula (10) include
4,4'-dimethylsulfonyloxybiphenyl,
4,4'-dimethylsulfonyloxy-3,3'-dipropenylbiphenyl,
4,4'-dibromobiphenyl, 4,4'-diiodobiphenyl,
4,4'-dimethylsulfonyloxy-3,3'-dimethylbiphynyl,
4,4'-dimethylsulfonyloxy-3,3'-difluorobiphenyl,
4,4'-dimethylsulfonyloxy-3,3',5,5'-tetrafluorobiphenyl,
4,4'-dibromooctafluorobiphenyl,
4,4-methylsulfonyloxyoctafluorobiphenyl,
3,3'-diallyl-4,4'-bis(4-fluorobenzenesulfonyloxy)biphenyl,
4,4'-dichloro-2,2'-trifluoromethylbiphenyl,
4,4'-dibromo-2,2'-trifluoromethylbiphenyl,
4,4'-diiodo-2,2'-trifluoromethylbiphenyl,
bis(4-chlorophenyl) sulfone,
4,4'-dichlorobenzophenone, and
2,4-dichlorobenzophenone.

The compounds represented by general formula (10) can be used alone or in combination of two or more thereof.

In general formula (11), $R^{11}$ represents an alkyl group having 1 to 20 carbon atoms, a halogenated alkyl group, a cyano group, a nitro group, an alkoxyl group having 1 to 20 carbon atoms, an allyl group, an aryl group, a halogen atom or —OSO$_2$Z; $R^{14}$ and $R^{15}$ each represent —OSO$_2$Z (wherein Z represents an alkyl group, a halogenoalkyl group, or an aryl group), a chlorine atom, a bromine atom, or an iodine atom; and f is an integer of 0 to 4.

Specific examples of $R^{11}$ are as follows. Examples of the halogen atom include fluorine. Examples of the monovalent organic groups include alkyl groups such as methyl and ethyl, halogenoalkyl groups such as trifluoromethyl and pentafluoroethyl, allyl groups such as propenyl, and aryl groups such as phenyl and pentafluorophenyl. Examples of Z contained in —OSO$_2$Z include alkyl groups such as methyl and ethyl, halogenoalkyl groups such as trifluoromethyl, and aryl groups such as phenyl, p-tolyl, and p-fluorophenyl.

Examples of the compounds represented by general formula (11) include o-dichlorobenzene, o-dibromobenzene, o-diiodobenzene, o-dimethylsulfonyloxybenzene, 2,3-dichlorotoluene, 2,3-dibromotoluene, 2,3-diiodotoluene, 3,4-dichlorotoluene, 3,4-dibromotoluene, 3,4-diiodotoluene, 2,3-dimethylsulfonyloxybenzene, 3,4-dimethylsulfonyloxybenzene, m-dichlorobenzene, m-dibromobenzene, m-diiodobenzene, m-dimethylsulfonyloxybenzene, 2,4-dichlorotoluene, 2,4-dibromotoluene, 2,4-diiodotoluene, 3,5-dichlorotoluene, 3,5-dibromotoluene, 3,5-diiodotoluene, 2,6-dichlorotoluene, 2,6-dibromotoluene, 2,6-diiodotoluene, 3,5-dimethylsulfonyloxytoluene, 2,6-dimethylsulfonyloxytoluene, 2,4-dichlorobenzotrifluoride, 2,4-dibromobenzotrifluoride, 2,4-diiodobenzotrifluoride, 3,5-dichlorobenzotrifluoride, 3,5-dibromotrifluoride, 3,5-diiodobenzotrifluoride, 1,3-dibromo-2,4,5,6-tetrafluorobenzene, 2,4-dichlorobenzyl alcohol, 3,5-dichlorobenzyl alcohol, 2,4-dibromobenzyl alcohol, 3,5-dibromobenzyl alcohol, 3,5-dichlorophenol, 3,5-dibromophenol, 3,5-dichloro-t-butoxycarbonyloxyphenyl, 3,5-dibromo-t-butoxycarbonyloxyphenyl, 2,4-dichlorobenzoic acid, 3,5-dichlorobenzoic acid, 2,4-dibromobenzoic acid, 3,5-dibromobenzoic acid, methyl 2,4-dichlorobenzoate, methyl 3,5-dichlorobenzoate, methyl 3,5-dibromobenzoate, methyl 2,4-dibromobenzoate, t-butyl 2,4-dichlorobenzoate, t-butyl 3,5-dichlorobenzoate, t-butyl 2,4-dibromobenzoate, and t-butyl 3,5-dibromobenzoate. Preferred of these are m-dichlorobenzene, 2,4-dichlorotoluene, 3,5-dimethylsulfonyloxytoluene, 2,4-dichlorobenzotrifluoride, 2,4-dichlorobenzophenone, 2,4-dichlorophenoxybenzene, and the like.

The compounds represented by general formula (11) can be used alone or in combination of two or more thereof.

In the polymer (1), the repeating structural units are contained in such a proportion that in general formula (1), g is from 5 to 100% by mole, preferably from 5 to 95% by mole, h is from 0 to 95% by mole, preferably from 0 to 90% by mole, and i is from 0 to 95% by mole, preferably from 0 to 90% by mole (provided that g+h+i=100% by mole).

If g is below 5% by mole (h or i exceeds 95% by mole), there are cases where the polymer has poor solubility in organic solvents.

The catalyst to be used in producing the polymer (1) is preferably a catalyst system containing a transition metal compound. This catalyst system comprises as essential ingredients (i) either a combination of a transition metal salt and one or more ligands or a transition metal (salt) having one or more ligands coordinated thereto and (ii) a reducing agent. A salt may be added to the catalyst system in order to heighten the rate of polymerization.

Examples of the transition metal salt include nickel compounds such as nickel chloride, nickel bromide, nickel iodide, and nickel acetylacetonate, palladium compounds such as palladium chloride, palladium bromide, and palladium iodide, iron compounds such as iron chloride, iron bromide, and iron iodide, and cobalt compounds such as cobalt chloride, cobalt bromide, and cobalt iodide. Especially preferred of these are nickel chloride and nickel bromide.

Examples of the ligands include triphenylphosphine, 2,2'-bipyridine, 1,5-cyclooctadiene, and 1,3-bis(diphenylphosphino)propane. Preferred of these are triphenylphosphine and 2,2'-bipyridine. These ligands may be used alone or in combination of two or more thereof.

Examples of the transition metal (salt) having one or more ligands coordinated thereto include nickel chloride bis(triphenylphosphine), nickel bromide bis(triphenylphosphine), nickel iodide bis(triphenylphosphine), nickel nitrate bis(triphenylphosphine), nickel chloride 2,2'-bipyridine, nickel bromide 2,2'-bipyridine, nickel iodide 2,2'-bipyridine, nickel nitrate 2,2'-bipyridine, bis(1,5-cyclooctadiene)nickel, tetrakis(triphenylphosphine)nickel, tetrakis(triphenylphosphite)nickel, and tetrakis(triphenylphosphine)palladium. Preferred of these are nickel chloride bis(triphenylphosphine) and nickel chloride 2,2'-bipyridine.

Examples of the reducing agent which can be used in the catalyst system include iron, zinc, manganese, aluminum, magnesium, sodium, and calcium. Preferred of these are zinc and manganese. These reducing agents can be used after having been further activated by contact with an acid or an organic acid.

Examples of the salt which can be optionally used in the catalyst system include sodium compounds such as sodium fluoride, sodium chloride, sodium bromide, sodium iodide, and sodium sulfate, potassium compounds such as potassium fluoride, potassium chloride, potassium bromide, potassium iodide, and potassium sulfate, and ammonium compounds such as tetraethylammonium fluoride, tetraethylammonium chloride, tetraethylammonium bromide, tetraethylammonium iodide, and tetraethylammonium sulfate. Preferred of these are sodium bromide, sodium iodide, potassium bromide, tetraethylammonium bromide, and tetraethylammonium iodide.

In the catalyst system, the proportions of the ingredients to be used therein are as follows. The proportion of either the transition metal salt or the transition metal (salt) having one or more ligands coordinated thereto is generally from 0.0001 to 10 mol, preferably from 0.01 to 0.5 mol, per mol of all the compounds represented by general formulae (3), (10), and (11). If the proportion thereof is smaller than 0.0001 mol, the polymerization reaction does not proceed sufficiently. On the other hand, if the proportion thereof exceeds 10 mol, there are cases where the polymerization yields a polymer having a low molecular weight.

In the case where the catalyst system comprises a transition metal salt and one or more ligands, the proportion of the ligands is generally from 0.1 to 100 µmol, preferably from 1 to 10 mol, per mol of the transition metal salt. If the proportion thereof is smaller than 0.1 mol, the result is insufficient catalytic activity. On the other hand, proportions thereof exceeding 100 mol pose a problem that the polymerization yields a polymer having a low molecular weight.

The proportion of the reducing agent to be used in the catalyst system is generally from 0.1 to 100 mol, preferably from 1 to 10 mol, per mol of all the compounds represented by general formulae (3), (10), and (11). If the proportion thereof is smaller than 0.1 mol, the polymerization does not proceed sufficiently. On the other hand, if the proportion thereof exceeds 100 mol, there are cases where the polymer obtained is difficult to purify.

In the case where the salt as an optional ingredient is used in the catalyst system, the proportion thereof is generally from 0.001 to 100 mol, preferably from 0.01 to 1 mol, per mol of all the compounds represented by general formulae (3), (10), and (11). If the proportion thereof is smaller than 0.001 mol, the effect of heightening the rate of polymerization is insufficient. On the other hand, if the proportion thereof exceeds 100 mol, there are cases where the polymer obtained is difficult to purify.

Examples of polymerization solvents which can be used in the invention include tetrahydrofuran, cyclohexanone, dimethyl sulfoxide, N,N-dimethylformamide, N,N-dimethylacetamide, 1-methyl-2-pyrrolidone, γ-butyrolactone, and γ-butyrolactam. Preferred of these are tetrahydrofuran, N,N-dimethylformamide, N,N-dimethylacetamide, and 1-methyl-2-pyrrolidone. It is preferred to sufficiently dry these polymerization solvents before use.

The concentration of all the compounds represented by general formulae (3), (10), and (11) in the polymerization solvent is generally from 1 to 100% by weight, preferably from 5 to 40% by weight.

The polymerization for yielding the polymer is conducted at a temperature of generally from 0 to 200° C., preferably from 50 to 80° C., for a period of usually from 0.5 to 100 hours, preferably from 1 to 40 hours.

The polymer (1) described above has a weight-average molecular weight, calculated for standard polystyrene, of generally from 1,000 to 1,000,000.

Polymer (2):

The polymer represented by general formula (2) can be produced, for example, by polymerizing monomers comprising compounds represented by the following general formulae (12) to (14) in the presence of a catalyst system.

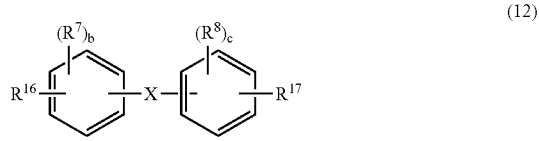

(12)

In general formula (12), $R^7$ and $R^8$ each independently represent a hydrocarbon group having 1 to 20 carbon atoms, a cyano group, a nitro group, an alkoxyl group having 1 to 20 carbon atoms, an aryl group, or a halogen atom; X is at least one member selected from the group consisting of groups represented by —CQQ'— (wherein Q and Q' may be the same or different and each represent a halogenoalkyl group, an alkyl group, a hydrogen atom, a halogen atom, or an aryl group) and a fluorenylene group; b and c each are an integer of 0 to 4; and $R^{16}$ and $R^{17}$ each represent at least one member selected from the group consisting of a hydroxyl group, a halogen atom, and an —OM group (wherein M is an alkali metal).

Examples of the compound (monomer) represented by general formula (12) include
2,2-bis(4-hydroxyphenyl)hexafluoropropane,
bis(4-hydroxyphenyl)methane,
bis(4-hydroxyphenyl)diphenylmethane,
2,2-bis(4-hydroxy-3-methylphenyl)hexafluoropropane,
2,2-bis(4-hydroxy-3-propenylphenyl)hexafluoropropane,
2,2-bis(4-hydroxy-3,5-dimethylphenyl)hexafluoropropane,
2,2-bis(4-hydroxyphenyl)propane,
2,2-bis(4-hydroxy-3-methylphenyl)propane,
2,2-bis(4-hydroxy-3-propenylphenyl)propane,
2,2-bis(4-hydroxy-3,5-dimethylphenyl)propane,
2,2-bis(4-hydroxy-3-fluorophenyl)propane,
2,2-bis(4-hydroxy-3,5-difluorophenyl)propane,
2,2-bis(4-chlorophenyl)hexafluoropropane,
bis(4-chlorophenyl)methane,
bis(4-chlorophenyl)diphenylmethane,
2,2-bis(4-chloro-3-methylphenyl)hexafluoropropane,
2,2-bis(4-chloro-3-propenylphenyl)hexafluoropropane,
2,2-bis(4-chloro-3,5-dimethylphenyl)hexafluoropropane,
2,2-bis(4-chlorophenyl)propane,
2,2-bis(4-chloro-3-methylphenyl)propane,
2,2-bis(4-chloro-3-propenylphenyl)propane,
2,2-bis(4-chloro-3,5-dimethylphenyl)propane,
2,2-bis(4-chloro-3-fluorophenyl)propane,
2,2-bis(4-chloro-3,5-difluorophenyl)propane,
2,2-bis(4-chlorophenyl)hexafluoropropane,
bis(4-bromophenyl)methane,
bis(4-bromophenyl)diphenylmethane,
2,2-bis(4-bromo-3-methylphenyl)hexafluoropropane,
2,2-bis(4-bromo-3-propenylphenyl)hexafluoropropane,
2,2-bis(4-bromo-3,5-dimethylphenyl)hexafluoropropane,
2,2-bis(4-bromophenyl)propane,
2,2-bis(4-bromo-3-methylphenyl)propane,
2,2-bis(4-bromo-3-propenylphenyl)propane,
2,2-bis(4-bromo-3,5-dimethylphenyl)propane,
2,2-bis(4-bromo-3-fluorophenyl)propane,
2,2-bis(4-bromo-3,5-difluorophenyl)propane,
bis(4-fluorophenyl)methane,
bis(4-fluorophenyl)diphenylmethane,
2,2-bis(4-fluoro-3-methylphenyl)hexafluoropropane,
2,2-bis(4-fluoro-3-propenylphenyl)hexafluoropropane,
2,2-bis(4-fluoro-3,5-dimethylphenyl)hexafluoropropane,
2,2-bis(4-fluorophenyl)propane,
2,2-bis(4-fluoro-3-methylphenyl)propane,
2,2-bis(4-fluoro-3-propenylphenyl)propane,
2,2-bis(4-fluoro-3,5-dimethylphenyl)propane,
2,2-bis(4-fluoro-3-fluorophenyl)propane, and
2,2-bis(4-fluoro-3,5-difluorophenyl)propane.

The bisphenol compounds enumerated above may be used after having been reacted with a basic compound containing sodium, potassium, or the like to convert the hydroxyl groups into —OM groups (wherein M is an alkali metal).

In the invention, two or more compounds represented by general formula (12) may be copolymerized.

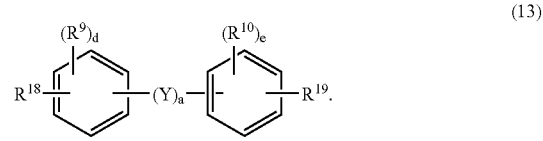

(13)

In general formula (13), $R^9$ and $R^{10}$ each independently represent a hydrocarbon group having 1 to 20 carbon atoms, a cyano group, a nitro group, an alkoxyl group having 1 to 20 carbon atoms, an aryl group, or a halogen atom; $R^{18}$ and $R^{19}$ each represent at least one member selected from the group consisting of a hydroxyl group, a halogen atom, and an —OM group (wherein M is an alkali meal); Y is at least one member selected from the group consisting of —O—, —CO—, —COO—, —CONH—, —S—, —SO$_2$—, and a phenylene group; a is 0 or 1; and d and e each are an integer of 0 to 4.

Examples of the compound represented by general formula (13) include 4,4'-dichlorobiphenyl, 4,4'-dibromobiphenyl, 4,4'-difluorobiphenyl, 4,4'-diiodobiphenyl, 4,4'-dihydroxybiphenyl, 4,4'-dihydroxy-3,3'-dipropenylbiphenyl, 4,4'-dihydroxy-3,3'-dimethylbiphenyl, 4,4'-dihydroxy-3,3'-diethylbiphenyl, 4,4'-dimethylhydroxy-3,3',5,5'-tetrafluorobiphenyl, 4,4'-dibromooctafluorobiphenyl, 4,4'-dihydroxyoctafluorobiphenyl, 3,3'-diallyl-4,4'-bis(4-hydroxy)biphenyl, 4,4'-dichloro-2,2'-trifluoromethylbiphenyl, 4,4'-dibromo-2,2'-trifluoromethylbiphenyl, 4,4'-diiodo-2,2'-trifluoromethylbiphenyl, bis(4-chlorophenyl) sulfone, bis(4-hydroxyphenyl) sulfone, bis(4-chlorophenyl) ether, bis(4-hydroxyphenyl) ether, 4'-dichlorobenzophenone, 4,4'-dihydroxybenzophenone, 2,4-dichlorobenzophene, and 2,4-dihydroxybenzophenone.

The bisphenol compounds enumerated above may be used after having been reacted with a basic compound containing sodium, potassium, or the like to convert the hydroxyl groups into —OM groups (wherein M is an alkali metal).

The compounds represented by general formula (13) may be used alone or in combination of two or more thereof.

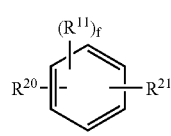
(14)

In general formula (14), $R^{11}$ represents a hydrocarbon group having 1 to 20 carbon atoms, a cyano group, a nitro group, an alkoxyl group having 1 to 20 carbon atoms, an aryl group, or a halogen atom; $R^{14}$ and $R^{15}$ each represent —$OSO_2Z$ (wherein Z represents an alkyl group, a halogenoalkyl group, or an aryl group), a chlorine atom, a bromine atom, or an iodine atom; and f is an integer of 0 to 4.

Examples of the compound represented by general formula (14) include 1,2-dihydroxybenzen, 1,3-dihydroxybenzene, 1,4-dihydroxybenzene, 2,3-dihydroxytoluene, 2,5-dihydroxytoluene, 2,6-dihydroxytoluene, 3,4-dihydroxytoluene, 3,5-dihydroxytoluene, o-dichlorobenzene, o-dibromobenzene, o-diiodobenzene, o-dimethylsulfonyloxybenzene, 2,3-dichlorotoluene, 2,3-dibromotoluene, 2,3-diiodotoluene, 3,4-dichlorotoluene, 3,4-dibromotoluene, 3,4-diiodotoluene, 2,3-dimethylsulfonyloxybenzene, 3,4-dimethylsulfonyloxybenzene, m-dichlorobenzene, m-dibromobenzene, m-diiodobenzene, m-dimethylsulfonyloxybenzene, 2,4-dichlorotoluene, 2,4-dibromotoluene, 2,4-diiodotoluene, 3,5-dichlorotoluene, 3,5-dibromotoluene, 3,5-diiodotoluene, 2,6-dichlorotoluene, 2,6-dibromotoluene, 2,6-diiodotoluene, 3,5-dimethylsulfonyloxytoluene, 2,6-dimethylsulfonyloxytoluene, 2,4-dichlorobenzotrifluoride, 2,4-dibromobenzotrifluoride, 2,4-diiodobenzotrifluoride, 3,5-dichlorobenzotrifluoride, 3,5-dibromotrifluoride, 3,5-diiodobenzotrifluoride, 1,3-dibromo-2,4,5,6-tetrafluorobenzene, 2,4-dichlorobenzyl alcohol, 3,5-dichlorobenzyl alcohol, 2,4-dibromobenzyl alcohol, 3,5-dibromobenzyl alcohol, 3,5-dichlorophenol, 3,5-bibromophenol, 3,5-dichloro-t-butoxycarbonyloxyphenyl, 3,5-dibromo-t-butoxycarbonyloxyphenyl, 2,4-dichlorobenzoic acid, 3,5-dichlorobenzoic acid, 2,4-dibromobenzoic acid, 3,5-dibromobenzoic acid, methyl 2,4-dichlorobenzoate, methyl 3,5-dichlorobenzoate, methyl 3,5-dibromobenzoate, methyl 2,4-dibromobenzoate, t-butyl 2,4-dichlorobenzoate, t-butyl 3,5-dichlorobenzoate, t-butyl 2,4-dibromobenzoate, and t-butyl 3,5-dibromobenzoate.

The bisphenol compounds enumerated above may be used after having been reacted with a basic compound containing sodium, potassium, or the like to convert the hydroxyl groups into —OM groups (wherein M is an alkali metal).

The compounds represented by general formula (14) may be used alone or in combination of two or more thereof.

In the polymer represented by general formula (2), the repeating structural units are contained in such a proportion that in general formula (2), j is from 0 to 100% by mole and k is from 0 to 100% by mole (provided that j+k=100% by mole).

The polymer represented by general formula (2) can by synthesized by heating the bisphenol compounds and the dihalogen compound in a solvent in the presence of an alkali metal compound.

The compounds of formulae (2) and (3) and the compound of formula (4) are used in such amounts that the proportion of the compounds of formulae (2) and (3) is generally from 45 to 55% by mole, preferably from 48 to 52% by mole, and that of the compound of formula (4) is generally from 55 to 45% by mole, preferably from 52 to 48% by mole. If the proportion of the compounds of formulae (2) and (3) is lower than 45% or exceeds 55%, there are cases where the polymer thus yielded is less apt to have a high molecular weight and shows poor applicability in coating film formation.

Examples of the alkali metal compound for use in this synthesis include sodium hydroxide, potassium hydroxide, lithium hydroxide, sodium carbonate, potassium carbonate, lithium carbonate, sodium hydrogen carbonate, potassium hydrogen carbonate, lithium hydrogen carbonate, sodium hydride, potassium hydride, lithium hydride, sodium metal, potassium metal, and lithium metal.

Those alkali metal compounds may be used alone or in combination of two or more thereof.

The amount of the alkali metal compound to be used is generally from 100 to 400% by mole, preferably from 100 to 250% by mole, based on the bisphenol compounds.

A promoter may be used for accelerating the reaction. Examples thereof include copper metal, cuprous chloride, cupric chloride, cuprous bromide, cupric bromide, cuprous iodide, cupric iodide, cuprous sulfate, cupric sulfate, cuprous acetate, cupric acetate, cuprous formate, and cupric formate.

The amount of the promoter to be used is generally from 1 to 50% by mole, preferably from 1 to 30% by mole, based on the bisphenol compounds.

Examples of the solvent for use in the reaction include pyridine, quinoline, benzophenone, diphenyl ether, dialkoxybenzenes (the alkoxyl groups each have 1 to 4 carbon atoms), trialkoxybenzenes (the alkoxyl groups each have 1 to 4 carbon atoms), diphenyl sulfone, dimethyl sulfoxide, dimethyl sulfone, diethyl sulfoxide, diethyl sulfone, diisopropyl sulfone, tetrahydrofuran, tetrahydrothiophene, sulfolane, N-methyl-2-pyrrolidone, N-ethyl-2-pyrrolidone, dimethylimidazolidinone, γ-butyrolactone, dimethylformamide, and dimethylacetamide.

Those solvents may be used alone or in combination of two or more thereof.

In synthesizing the polymer represented by general formula (2), the concentration of solution for reaction is generally from 2 to 50% by weight on monomer weight basis, and the reaction temperature is generally from 50 to 250° C.

For removing the metal salt generated in the polymer synthesis and the unreacted monomers, the resultant reaction mixture is preferably subjected to filtration, reprecipitation from a poor solvent for the polymer, and washing with an acid or alkaline aqueous solution.

The polymer represented by general formula (2) thus obtained has a weight-average molecular weight as determined by GPC of generally from 500 to 500,000, preferably from 800 to 100,000.

I. Diyne-Containing (Co)Polymer

The diyne-containing (co)polymer of the invention is characterized by containing repeating units represented by formula (1) in an amount of 10 mol % or larger and having a weight-average molecular weight of from 500 to 1,000,000.

The diyne-containing (co) polymer of the invention will be described below in greater detail with respect to each constituent.

1. Repeating Units Represented by Formula (36)

The diyne-containing (co)polymer of the invention has repeating units represented by formula (37) in an amount of 10 mol % or larger. For convenience of explanation, formula (36) is again shown below.

$$-[C{\equiv}C-(Y_1)_n-C{\equiv}C-Ar]- \quad (36)$$

wherein $Y_1$ represents a bivalent organic group represented by the following formula (37) or (38); Ar represents a bivalent organic group; and n represents 0 or 1;

$$\begin{array}{c} -C{=}C- \\ | \quad | \\ R^{25} \; R^{26} \end{array} \quad (37)$$

wherein $R^{25}$ and $R^{26}$ may be the same or different, are located in the cis positions, and each represents a hydrogen atom, an alkyl group, or an aryl group;

(38)

[structure showing benzene ring with $R^{27}$, $R^{28}$, $R^{29}$, $R^{30}$ substituents]

wherein $R^{27}$ to $R^{30}$ may be the same or different and each represents a hydrogen atom, a fluorine atom, an alkyl group, a halogenated alkyl group or an aryl group.

In formula (37), examples of the alkyl group represented by $R^{25}$ or $R^{26}$ include methyl, ethyl, isopropyl, and n-propyl; and examples of the aryl group include phenyl.

In formula (38), examples of the alkyl group represented by each of $R^{27}$ to $R^{30}$ include methyl, ethyl, isopropyl, and n-propyl; examples of the halogenated alkyl group include trifluoromethyl and pentafluoroethyl; and examples of the aryl group include phenyl and pentafluorophenyl.

Examples of the bivalent organic group represented by $Y_1$ in formula (36) include cis-vinylene and 1,2-phenylene.

Examples of the bivalent organic group represented by Ar in formula (36) include 1,2-phenylene, 1,3-phenylene, 1,4-phenylene, and the following groups (a) to (j).

(a) [diphenyl ether structure]

(b) [diphenyl ether with methyl groups]

(c) [diphenyl ether with methyl groups]

(d) [spirobifluorene structure with methyl groups]

(e) [hexafluoroisopropylidene bridged biphenyl, $CF_3$ groups]

(f) [tetraphenylmethane structure]

(g) [biphenyl structure]

(h) [isopropylidene bridged biphenyl, $CH_3$ groups]

(i) [naphthalene structure]

(j) [diphenyl sulfide structure]

Preferred of these are aromatic groups such as 1,3-phenylene, 1,4-phenylene, and the groups (a) and (d).

The diyne-containing (co) polymer of the invention has repeating units represented by formula (36) in an amount of 10 mol % or larger, preferably 20 mol % or larger, more preferably 30 mol % or larger, most preferably 50 mol % or larger. If the content of the repeating units is lower than 10 mol %, the (co)polymer gives a cured film having insufficient solvent resistance.

2. Weight-Average Molecular Weight

The weight-average molecular weight of the diyne-containing (co)polymer of the invention is from 500 to 1,000, 000, preferably from 1,000 to 200,000. If the weight-average molecular weight thereof is lower than 500, the (co)polymer gives a coating film having insufficient properties. If the weight-average molecular weight thereof exceeds 1,000, 000, the (co)polymer has insufficient solubility in organic solvents, resulting in an increased viscosity and a coating film (cured film) having poor smoothness.

II. Processes for Producing Diyne-Containing (Co)Polymer

One process of the invention for producing a diyne-containing (co)polymer comprises polymerizing (A1) at least one member selected from the group consisting of compounds represented by formula (39) given after and compounds represented by formula (40) given after with (B1) at least one compound represented by formula (41) given after (hereinafter, this process is often referred to as "first process").

Another process of the invention for producing a diyne-containing (co)polymer comprises polymerizing (A2) at least one member selected from the group consisting of compounds represented by formula (42) given after and compounds represented by formula (43) given after with (B2) at least one compound represented by formula (44) given after (hereinafter, this process is often referred to as "second process").

1. First Process

In the first process, polymerizable ingredient (A1) is polymerized with polymerizable ingredient (B1).

(1) Polymerizable Ingredient (A1)

Polymerizable ingredient (A1) is at least one member selected from the group consisting of compounds represented by formula (39) and compounds represented by formula (40).

(i) Compounds Represented by Formula (39)

Formula (39) is shown below.

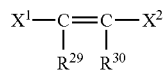

(39)

[In formula (39), $X^1$ and $X^2$ may be the same or different, are located in the cis positions, and each represents a halogen atom; and $R^{29}$ and $R^{30}$ may be the same or different and each represents a hydrogen atom, an alkyl group, or an aryl group.]

Examples of the halogen atoms represented by $X^1$ and $X^2$, which are located in the cis positions, in formula (39) include chlorine, bromine, and iodine atoms.

Examples of the alkyl group represented by $R^{29}$ or $R^{30}$ in formula (39) include methyl, ethyl, isopropyl, and n-propyl. Examples of the aryl group in formula (39) include phenyl.

Examples of the compounds represented by formula (39) include cis-1,2-dichloroethylene, cis-1,2-dibromoethylene, and cis-1,2-diiodoethylene.

(ii) Compounds Represented by Formula (40)

Formula (40) is shown below.

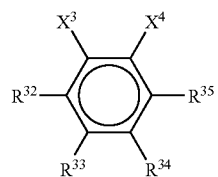

(40)

[In formula (40), $X^3$ and $X^4$ may be the same or different and each represents a halogen atom or $—SO_3R^{31}$, wherein $R^3$ represents an alkyl group, a fluoroalkyl group, or an aryl group; and $R^{32}$ to $R^{35}$ may be the same or different and each represents a hydrogen atom, a fluorine atom, an alkyl group, a halogenated alkyl group, or an aryl group.]

Examples of the halogen atom represented by $X^3$ or $X^4$ in formula (40) include bromine and iodine atoms. In the group represented by $—SO_3R^{31}$, examples of the alkyl group represented by $R^{31}$ include methyl, ethyl, isopropyl, and n-propyl; examples of the fluoroalkyl group represented by $R^{31}$ include trifluoromethyl and pentafluoroethyl; and examples of the aryl group represented by $R^{31}$ include phenyl, pentafluorophenyl, p-tolyl, and p-fluorophenyl. Examples of the group represented by $—SO_3R^{31}$ include methylsulfonyloxy, trifluoromethylsulfonyloxy, phenylsulfonyloxy, trifluoromethylsulfonyloxy, phenylsulfonyloxy, p-tolylsulfonyloxy, and p-fluorophenylsulfonyloxy.

Examples of the compounds represented by formula (40) include 1,2-dibromobenzene, 1,2-diiodobenzene, and 1,2-di(trifluoromethylsulfonyloxy)benzene.

The compounds represented by formulae (39) and (40) enumerated above as examples of polymerizable ingredient (A1) can be used alone or in combination of two or more thereof.

(2) Polymerizable Ingredient (B1)

Polymerizable ingredient (B1) is at least one compound represented by formula (41).

Formula (41) is shown below.

(41)

[In formula (41), Ar' represents a bivalent organic group.]

Examples of the bivalent organic group represented by Ar' in formula (41) include 1,2-phenylene, 1,3-phenylene, 1,4-phenylene, and the groups (a) to (j) shown above.

Preferred of these are 1,3-phenylene, 1,4-phenylene, and the groups (a) and (d) shown above.

Examples of the compound represented by formula (41) include 1,2-diethynylbenzene, 1,3-diethynylbenzene, 1,4-diethynylbenzene, 1,2,4-triethynylbenzene, 1,3,5-triethynylbenzene, 2,5-diethynyltoluene, 3,4-diethynyltoluene, 4,4'-diethynylbiphenyl, 3,3'-diethynylbiphenyl, 3,4'-diethynylbiphenyl, 4,4'-diethynyldiphenyl ether, 3,3'-diethynyldiphenyl ether, 3,4'-diethynyldiphenyl ether, 4,4'-diethynylbenzophenone, 3,3'-diethynylbenzophenone, 3,4'-diethynylbenzophenone, 4,4'-diethynyldiphenylmethane, 3,3'-diethynyldiphenylmethane, 3,4'-diethynyldiphenylmethane, 4,4'-diethynylbenzoic acid phenyl ester, 3,3'-diethynylbenzoic acid phenyl ester, 3,4'-diethynylbenzoic acid phenyl ester, 4,4'-diethynylbenzanilide, 3,3'-diethynylbenzanilide, 3,4'-diethynylbenzanilide, 4,4'-diethynyldiphenyl sulfide, 3,3'-diethynyldiphenyl sulfide, 3,4'-diethynyldiphenyl sulfide, 4,4'-diethynyldiphenyl sulfone, 3,3'-diethynyldiphenyl sulfone, 3,4'-diethynyldiphenyl sulfone, 2,4,4'-triethynyldiphenyl ether, 9,9-bis(4-ethynylphenyl)fluorene, 4,4''-diethynyl-p-terphenyl, 4,4''-diethynyl-m-terphenyl, 4,4''-diethynyl-o-terphenyl, 2,2-bis(4-ethynylphenyl)propane, 2,2-bis(4-ethynylphenyl)hexafluoropropane, bis(4-ethynylphenyl)diphenylmethane, 9,9-bis[4-(4-ethynylphenoxy)phenyl]fluorene, 9,9-bis[4-(3-ethynylphenoxy)phenyl]fluorene, 4,4'-diethynylbibenzyl, 1,4-diethynylnaphthalene, 9,10-diethynylanthracene, 2,6-diethynylpyridine, 2,3-diethynylthiophene, 2,5-diethynylthiophene, 3,4-diethynylthiophene, 2,5-diethynylfuran, and 4,4'-diethynyldibenzofuran. Especially preferred from the standpoint of heat resistance are 1,2- diethynylbenzene, 1,3-diethynylbenzene, 1,4-diethynylbenzene, 1,2,4-triethynylbenzene, 1,3,5-triethynylbenzene, 2,5-diethynyltoluene, 3,4-diethynyltoluene, 4,4'-diethynylbiphenyl, 3,3'-diethynylbiphenyl, 3,4'-diethynylbiphenyl, 4,4'-diethynyldiphenyl ether, 3,3'-diethynyldiphenyl ether, 3,4'-diethynyldiphenyl ether, and 9,9-bis(4-ethynylphenyl)fluorene.

The compounds represented by formula (6) enumerated above as examples of polymerizable ingredient (B1) can be used alone or in combination of two or more thereof.

In the first process, the molar ratio of polymerizable ingredient (A1) to polymerizable ingredient (B1), (A1)/(B1), is preferably from 0.1 to 2.0, more preferably from 0.5 to 1.5, most preferably from 0.9 to 1.1.

The polymerization of polymerizable ingredient (A1) with polymerizable ingredient (B1) in the first process is preferably conducted in the presence of a catalyst system containing a transition metal compound (preferably the catalyst system described below which comprises a combination of a palladium catalyst comprising a palladium compound with a basic compound).

The catalyst for use in the first process is preferably a catalyst system comprising a transition metal compound and a basic compound. This catalyst system is preferably constituted of the following components:
1) one or more compounds comprising a palladium salt and ligands or comprising palladium (salt) having ligands coordinated thereto (ligands may be added according to need);
2) a compound of univalent copper.

Examples of the palladium salt include palladium chloride, palladium bromide, and palladium iodide. Examples of the ligands include triphenylphosphine, tri-o-tolylphosphine, tricyanophenylphosphine, and tricyanomethylphosphine. Preferred of these is triphenylphosphine.

Examples of the palladium (salt) having ligands coordinated thereto beforehand include dichlorobis(triphenylphosphine)palladium, dibromobis(triphenylphosphine)palladium, diiodobis(triphenylphosphine)palladium, dichlorobis(tri-o-tolylphosphine)palladium, dichlorobis(tricyanophenylphosphine)palladium, dichlorobis(tricyanomethylphosphine)palladium, dibromobis(tri-o-tolylphosphine)palladium, dibromobis(tricyanophenylphosphine)palladium, dibromobis(tricyanomethylphosphine)palladium, diiodobis(tri-o-tolylphosphine)palladium, diiodobis(tricyanophenylphosphine)palladium, diiodobis(tricyanomethylphosphine)palladium, tetrakis(triphenylphosphine)palladium, tetrakis(tri-o-tolylphosphine)palladium, tetrakis(tricyanophenylphosphine)palladium, and tetrakis(tricyanomethylphosphine)palladium. Preferred of these are dichlorobis(triphenylphosphine)palladium and tetrakis(triphenylphosphine)palladium.

Examples of the compound of univalent copper include copper(I) chloride, copper(I) bromide, and copper(I) iodide.

The catalyst components described above are used in the following proportions.

The palladium salt is used in an amount of preferably from 0.0001 to 10 mol, more preferably from 0.001 to 1 mol, per mol of the sum of all the polymerizable ingredients. If the amount thereof is smaller than 0.0001 mol, there are cases where the polymerization does not proceed sufficiently. On the other hand, if the amount thereof exceeds 10 mol, there are cases where purification is difficult.

The ligands are used in an amount of preferably from 0.0004 to 50 mol, more preferably from 0.004 to 5 mol, per mol of the sum of all the polymerizable ingredients. If the amount thereof is smaller than 0.0004 mol, there are cases where the polymerization does not proceed sufficiently. On the other hand, if the amount thereof exceeds 50 mol, there are cases where purification is difficult.

The palladium (salt) having ligands coordinated thereto beforehand is used in an amount of preferably from 0.0001 to 10 mol, more preferably from 0.001 to 1 mol., per mol of the sum of all the polymerizable ingredients. If the amount thereof is smaller than 0.0001 mol, there are cases where the polymerization does not proceed sufficiently. On the other hand, if the amount thereof exceeds 10 mol, there are cases where purification is difficult.

The compound of univalent copper is used in an amount of preferably from 0.0001 to 10 mol, more preferably from 0.001 to 1 mol, per mol of the sum of all the polymerizable ingredients. If the amount thereof is smaller than 0.0001 mol, there are cases where the polymerization does not proceed sufficiently. On the other hand, if the amount thereof exceeds 10 mol, there are cases where purification is difficult.

On the other hand, examples of the basic compound include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclooctane, diazabicyclononane, diazabicycloundecene, tetramethylammonium hydroxide, diethylamine, ammonia, n-butylamine, and imidazole. Preferred of these are diethylamine, piperidine, and n-butylamine.

The base is used in an amount of preferably from 1 to 1,000 mol, more preferably from 1 to 100 mol, per mol of the sum of all the polymerizable ingredients. If the amount thereof is smaller than 1 mol, there are cases where the polymerization does not proceed sufficiently. On the other hand, amounts thereof exceeding 100 mol are uneconomical.

A solvent can be used according to need in this process of the invention. The polymerization solvent is not particularly limited. Examples thereof include halogenated solvents such as chloroform, dichloromethane, 1,2-dichloroethane, chlorobenzene, and dichlorobenzene; aromatic hydrocarbon solvents such as benzene, toluene, xylene, mesitylene, and diethylbenzene; ether solvents such as diethyl ether, tetrahydrofuran (THF), dioxane, diglyme, and anisole; ketone solvents such as acetone, methyl ethyl ketone, 2-heptanone, and cyclohexanone; ester solvents such as ethyl acetate, ethyl lactate, and γ-butyrolactone; and amide solvents such as N,N-dimethylformamide, N,N-dimethylacetamide, and N-methyl-2-pyrrolidone. It is preferred to sufficiently dry and deoxidize these solvents before use.

The concentration of the monomers (polymerizable ingredients) in the polymerization solvent is preferably from 1 to 80% by weight, more preferably from 5 to 60% by weight.

The polymerization temperature in the first process is preferably from 0 to 150° C., more preferably from 10 to 100° C. The polymerization period is preferably from 0.5 to 100 hours, more preferably from 1 to 40 hours.

2. Second Process

In the second process, polymerizable ingredient (A2) is polymerized with polymerizable ingredient (B2).

(1) Polymerizable Ingredient (A2)

Polymerizable ingredient (A2) is at least one member selected from the group consisting of compounds represented by formula (42) and compounds represented by formula (43).

(i) Compounds Represented by Formula (42)

Formula (42) is shown below.

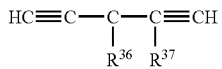

(42)

[In formula (7), $R^{36}$ and $R^{37}$ may be the same or different, are located in the cis positions, and each represents a hydrogen atom, an alkyl group, or an aryl group.]

Examples of the alkyl group represented by $R^{36}$ or $R^{37}$ in formula (42) include methyl, ethyl, isopropyl, and n-propyl. Examples of the aryl group in formula (42) include phenyl.

Examples of the compounds represented by formula (42) include (Z)-hex-3-ene-1,5-diyne.

(ii) Compounds Represented by Formula (43)

Formula (43) is shown below.

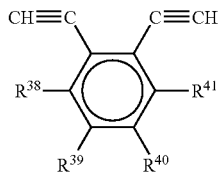

(43)

[In formula (43), $R^{38}$ to $R^{41}$ may be the same or different and each represents a hydrogen atom, a fluorine atom, an alkyl group, a halogenated alkyl group, or an aryl group.]

In formula (43), examples of the alkyl group represented by each of $R^{16}$ to $R^{19}$ include methyl, ethyl, isopropyl, and n-propyl; examples of the halogenated alkyl group include trifluoromethyl and pentafluoroethyl; and examples of the aryl group include phenyl and pentafluorophenyl.

Examples of the compounds represented by formula (43) include 1,2-diethynylbenzene.

The compounds represented by formulae (42) and (43) enumerated above as examples of polymerizable ingredient (A2) can be used alone or in combination of two or more thereof.

(2) Polymerizable Ingredient (B2)

Polymerizable ingredient (B2) is at least one compound represented by formula (44).

Formula (44) is shown below.

(44)

[In formula (44), $X^5$ and $X^6$ may be the same or different and each represents a halogen atom or —$SO_3R^{42}$, wherein $R^{43}$ represents an alkyl group, a fluoroalkyl group, or an aryl group; and Ar" represents a bivalent organic group.]

Examples of the halogen atom represented by $X^5$ or $X^6$ in formula (44) include bromine and iodine atoms. In the group represented by —$SO_3R^{42}$, examples of the alkyl group represented by $R^{42}$ include methyl, ethyl, isopropyl, and n-propyl; examples of the fluoroalkyl group represented by $R^{42}$ include trifluoromethyl and pentafluoroethyl; and examples of the aryl group represented by $R^{42}$ include phenyl, pentafluorophenyl, p-tolyl, and p-fluorophenyl. Examples of the group represented by —$SO_3R^{42}$ include methylsulfonyloxy, trifluoromethylsulfonyloxy, phenylsulfonyloxy, p-tolylsulfonyloxy, and p-fluorophenylsulfonyloxy.

Examples of the bivalent organic group represented by Ar" in formula (44) include 1,2-phenylene, 1,3-phenylene, 1,4-phenylene, and the groups (a) to (j) shown above.

Preferred of these are 1,3-phenylene, 1,4-phenylene, and the groups (a) and (d) shown above.

Examples of the compound represented by formula (44) include 1,2-dibromobenzene, 1,3-dibromobenzene, 1,4-dibromobenzene, 1,2-diiodobenzene, 1,3-diiodobenzene, 1,4-diiodobenzene, 1,2-di(trifluoromethylsulfonyloxy)benzene, 1,3-di(trifluoromethylsulfonyloxy)benzene, 1,4-di(trifluoromethylsulfonyloxy)benzene, 9,9-bis(4-bromophenyl)fluorene, 9,9-bis(4-iodophenyl)fluorene, 9,9-bis(4-trifluoromethylsulfonyloxyphenyl)fluorene, 9,9-bis[4-(4-bromophenoxy)phenyl]fluorene, 9,9-bis[4-(4-iodophenoxy)phenyl]fluorene, 3,3'-dibromodiphenyl ether, 3,3'-diiododiphenyl ether, 3,3'-di(trifluoromethylsulfonyloxy) diphenyl ether, 3,4'-dibromodiphenyl ether, 3,4'-diiododiphenyl ether, 3,4'-di(trifluoromethylsulfonyloxy) diphenyl ether, 4,4'-dibromodiphenyl ether, 4,4'-diiododiphenyl ether, 4,4'-di(trifluoromethylsulfonyloxy) diphenyl ether, 2,2-bis(4-bromophenyl)hexafluoropropane, 2,2-bis(4-iodophenyl)hexafluoropropane, 2,2-bis(4-trifluoromethylsulfonyloxyphenyl)hexafluoropropane, 2,5-dibromobenzotrifluoride, 1,2-dibromotetrafluorobenzene, 1,3-dibromotetrafluorobenzene, and 1,4-dibromotetrafluorobenzene.

The compounds represented by formula (44) enumerated above as examples of polymerizable ingredient (B2) can be used alone or in combination of two or more thereof.

In the second process, the molar ratio of polymerizable ingredient (A2) to polymerizable ingredient (B2), (A2)/(B2), is preferably from 0.5 to 2.0, more preferably from 0.7 to 1.5.

(3) Polymerization Method

In the second process, the same polymerization method as in the first process can be used.

3. Third Process

In the third process, at least one compound represented by formula (41) given above is oxidatively polymerized in the presence of a catalyst.

The catalyst used for oxidatively polymerizing the compound represented by formula (41) is preferably one comprising copper. Examples of this catalyst include copper metal, cuprous chloride, cupric chloride, cuprous bromide, cupric bromide, cuprous iodide, cupric iodide, cuprous sulfate, cupric sulfate, cuprous acetate, cupric acetate, cuprous formate, cupricformate, cuprousoxide, cupricoxide, copper(I) triflate, copper(I) methoxide, copper(II) triflate, copper(II) methoxide, copper(II) acetylacetonate, and copper(II) dipivaloylmethane. Preferred of these are the compounds of univalent copper. Especially preferred examples thereof include cuprous chloride, cuprous bromide, cuprous iodide, cuprous acetate, and cuprous formate.

A catalyst comprising silica or alumina and, supported thereon, any of the copper compounds enumerated above can also be used.

In polymerizing the compound represented by formula (41) in the presence of a catalyst, a promoter can be used in order to increase the molecular weight of the polymer which is being produced. Examples of the promoter include pyridine, quinoline, pyrrole, piperazine, pyrrolidine, piperidine, picoline, trimethylamine, triethylamine, tripropylamine, tributylamine, monoethanolamine, diethanolamine, dimethylmonoethanolamine, monomethyldiethanolamine, triethanolamine, bipyridine, N,N,N',N'-tetramethylethylenediamine, diazabicyclooctane, diazabicyclononane, diazabicycloundecene, tetramethylammonium hydroxide, diethylamine, ammonia, methylamine, ethylamine, propylamine, butylamine, and imidazole. Especially preferred are pyridine, bipyridine, quinoline, and N,N,N',N'-tetramethylethylenediamine.

In this process, the catalyst is used in an amount of generally from 0.0001 to 10 mol, preferably from 0.001 to 1 mol, per mol of all the compounds represented by formula (41). If the amount thereof is smaller than 0.0001 mol, there are cases where the polymerization does not proceed sufficiently. On the other hand, if the amount thereof exceeds 10 mol, there are cases where purification is difficult. The promoter is used in an amount of generally from 0.0004 to 50 mol, preferably from 0.004 to 5 mol, per mol of all the compounds represented by formula (41). If the amount of the promoter is smaller than 0.0004 mol, there are cases where the polymerization does not proceed sufficiently. On the other hand, if the promoter amount exceeds 50 mol, there are cases where polymer precipitation occurs.

A polymerization solvent can be used in this process. Examples thereof include halogenated solvents such as chloroform, dichloromethane, 1,2-dichloroethane, chlorobenzene, dichlorobenzene, and trichlorobenzene; aromatic hydrocarbon solvents such as benzene, toluene, xylene, mesitylene, and diethylbenzene; ether solvents such as diethyl ether, tetrahydrofuran, dioxane, diglyme, and anisole; ketone solvents such as acetone, methyl ethyl ketone, methyl isobutyl ketone, 2-heptanone, cyclohexanone, and cyclopentanone; ester solvents such as methyl acetate, ethyl acetate, methyl lactate, ethyl lactate, 7-butyrolactone, and γ-butyrolactam; amide solvents such as N,N-dimethylformamide, N,N-dimethylacetamide, N-methyl-2-pyrrolidone, and N-methylimidazolidinone; and polar solvents such as nitrobenzene, carbon disulfide, nitromethane, and dimethyl sulfoxide. Preferred of these are nitrobenzene, chloroform, dichloromethane, and 1,2-dichloroethane, which are excellent in the ability to dissolve the target polymer therein.

The concentration of the compound represented by formula (41) in the polymerization solvent is preferably from 1 to 80% by weight, more preferably from 5 to 60% by weight. If the concentration of the compound represented by formula (41) is lower than 1% by weight, it is difficult to increase the molecular weight of the polymer being produced. If the concentration thereof exceeds 80% by weight, there is the possibility of polymer precipitation.

The temperature for this polymerization is generally from 0 to 150° C., preferably from 10 to 100° C. The polymerization period is generally from 0.5 to 100 hours, preferably from 1 to 80 hours.

The polymer has a weight-average molecular weight, calculated for standard polystyrene, of generally from 500 to 200,000.

For enabling the oxidative polymerization of the compound represented by formula (41) to proceed in the invention, it is necessary to cause oxygen to be present in the reactant solution. It is therefore necessary to use a method comprising agitating the solution in air to thereby incorporate oxygen present in the air into the reaction mixture, or to bubble air and/or oxygen into the reaction mixture.

(B) Organic Solvent

A composition for forming the film of the invention is prepared by dissolving or dispersing ingredient (A) in an organic solvent (B).

Examples of the organic solvent (B) for use in the invention include aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, diisopropylbenzene, n-amylnaphthalene, and trimethylbenzene; monohydric alcohols such as methanol, ethanol, n-propanol, isopropanol, n-butanol, isobutanol, sec-butanol, t-butanol, n-pentanol, isopentanol, 2-methylbutanol, sec-pentanol, t-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyhydric alcohols such as ethylene glycol, 1,2-propylene glycol, 1,3-butylene glycol, pentanediol-2,4, 2-methylpentanediol-2,4, hexanediol-2,5, heptanediol-2,4, 2-ethylhexanediol-1,3, diethylene glycol, dipropylene glycol, triethylene glycol, tripropylene glycol, and glycerol; ketone solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, trimethylnonanone, cyclohexanone, 2-hexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxytriglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butylpropionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethyl sulfoxide, sulfolane, and 1,3-propanesultone.

Those solvents may be used alone or in combination of two or more thereof.

Other Additives

Ingredients such as colloidal silica, colloidal alumina, organic polymers other than ingredient (A), surfactants, silane coupling agents, triazene compounds, radical generators, compounds having one or more polymerizable double bonds, and compounds having one or more polymerizable triple bonds may be added to the composition for forming the film of the invention.

Examples of the organic polymers include polymers having a sugar chain structure, vinyl amide polymers, (meth)acrylic polymers, aromatic vinyl compound polymers, dendrimers, polyimides, poly(amic acid)s, polyamides, polyquinoxaline, polyoxadiazole, fluoropolymers, and polymers having a poly(alkylene oxide) structure.

Examples of the polymers having a poly(alkylene oxide) structure include polymers having a poly(methylene oxide) structure, poly(ethylene oxide) structure, poly(propylene oxide) structure, poly(tetramethylene oxide) structure, poly(butylene oxide) structure, or the like.

Specific examples thereof include ether type compounds such as polyoxymethylene alkyl ethers, polyoxyethylene alkyl ethers, polyoxyethylene alkylphenyl ethers, polyoxyethylene sterol ethers, polyoxyethylene lanolin derivatives, ethylene oxide derivatives of alkylphenol formalin condensates, polyoxyethylene/polyoxypropylene block copolymers, and polyoxyethylene/polyoxypropylene alkyl ethers; ether-ester type compounds such as polyoxyethylene glycerol fatty acid esters, polyoxyethylene sorbitan fatty acid esters, polyoxyethylene sorbitol fatty acid esters, and polyoxyethylene fatty acid alkanolamide sulfuric acid salts; and ether-ester type compounds such as polyethylene glycol fatty acid esters, ethylene glycol fatty acid esters, fatty acid monoglycerides, polyglycerol fatty acid esters, sorbitan fatty acid esters, propylene glycol fatty acid esters, and sucrose fatty acid esters.

Examples of the polyoxyethylene/polyoxypropylene block copolymers include compounds having either of the following block structures:

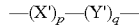

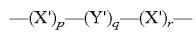

wherein X' represents —CH$_2$CH$_2$O—; Y' represents —CH$_2$CH(CH$_3$)O—; p is a number of 1 to 90; q is a number of 10 to 99; and r is a number of 0 to 90.

More preferred of those compounds enumerated above are ether type compounds such as polyoxyethylene alkyl ethers, polyoxyethylene/polyoxypropylene block copolymers, polyoxyethylene/polyoxypropylene alkyl ethers, polyoxyethylene glycerol fatty acid esters, polyoxyethylene sorbitan fatty acid esters, and polyoxyethylene sorbitol fatty acid esters.

Those compounds may be used alone or in combination of two or more thereof.

Examples of the surfactants include nonionic surfactants, anionic surfactants, cationic surfactants, and amphoteric surfactants, and further include fluorochemical surfactants, silicone surfactants, poly(alkylene oxide) surfactants, and poly(meth)acrylate surfactants. Preferred of these are fluorochemical surfactants and silicone surfactants.

Examples of the silane coupling agents include 3-glycidyloxypropyltrimethoxysilane, 3-aminoglycidyloxypropyltriethoxysilane, 3-methacryloxypropyltrimethoxysilane, 3-glycidyloxypropylmethyldimethoxysilane, 1-methacryloxypropylmethyldimethoxysilane, 3-aminopropyltrimethoxysilane, 3-aminopropyltriethoxysilane, 2-aminopropyltrimethoxysilane, 2-aminopropyltriethoxysilane, N-(2-aminoethyl)-3-aminopropyltrimethoxysilane, N-(2-aminoethyl)-3-aminopropylmethyldimethoxysilane, 3-ureidopropyltrimethoxysilane, 3-ureidopropyltriethoxysilane, N-ethoxycarbonyl-3-aminopropyltrimethoxysilane, N-ethoxycarbonyl-3-aminopropyltriethoxysilane, N-trimethoxysilylpropyltriethylenetriamine, N-triethoxysilylpropyltriethylenetriamine, 10-trimethoxysilyl-1,4,7-triazadecahe, 10-triethoxysilyl-1,4,7-triazadecane, 9-trimethoxysilyl-3,6-diazanonyl acetate, 9-triethoxysilyl-3,6-diazanonyl acetate, N-benzyl-3-aminopropyltrimethoxysilane, N-benzyl-3-aminopropyltriethoxysilane, N-phenyl-3-aminopropyltrimethoxysilane, N-phenyl-3-aminopropyltriethoxysilane, N-bis(oxyethylene)-3-aminopropyltrimethoxysilane, N-bis(oxyethylene)-3-aminopropyltriethoxysilane, poly(vinylmethoxysiloxane), and poly(vinylethoxysiloxane).

Those silane coupling agents may be used alone or in combination of two or more thereof.

Examples of the triazene compounds include 1,2-bis(3,3-dimethyltriazenyl)benzene, 1,3-bis(3,3-dimethyltriazenyl)benzene, 1,4-bis(3,3-dimethyltriazenyl)benzene, bis(3,3-dimethyltriazenylphenyl) ether, bis(3,3-dimethyltriazenylphenyl)methane, bis(3,3-dimethyltriazenylphenyl) sulfone, bis(3,3-dimethyltriazenylphenyl) sulfide, 2,2-bis[4-(3,3-dimethyltriazenylphenoxy)phenyl]-1,1,1,3,3, 3-hexafluoropropane, 2,2-bis[4-(3,3-dimethyltriazenylphenoxy)phenyl]propane, 1,3,5-tris(3,3-dimethyltriazenyl)benzene, 2,7-bis(3,3-dimethyltriazenyl)-9,9-bis[4-(3,3-dimethyltria zenyl)phenyl]fluorene, 2,7-bis(3,3-dimethyltriazenyl)-9,9-bis[3-methyl-4-(3,3-dim ethyltriazenyl)phenyl]fluorene, 2,7-bis(3,3-dimethyltriazenyl)-9,9-bis[3-phenyl-4-(3,3-dim ethyltriazenyl)phenyl]fluorene, 2,7-bis(3,3-dimethyltriazenyl)-9,9-bis[3-propenyl-4-(3,3-d imethyltriazenyl)phenyl]fluorene, 2,7-bis(3,3-dimethyltriazenyl)-9,9-bis[3-fluoro-4-(3,3-dim ethyltriazenyl)phenyl]fluorene, 2,7-bis(3,3-dimethyltriazenyl)-9,9-bis[3,5-difluoro-4-(3,3-dimethyltriazenyl)phenyl]fluorene, and 2,7-bis(3,3-dimethyltriazenyl)-9,9-bis[3-trifluoromethyl-4-(3,3-dimethyltriazenyl)phenyl]fluorene.

Those triazene compounds may be used alone or in combination of two or more thereof.

Examples of the radical generators include organic peroxides such as isobutyryl peroxide, α,α'-bis(neodecanoylperoxy)diisopropylbenzene, cumyl peroxyneodecanoate, di-n-propyl peroxydicarbonate, diisopropyl peroxydicarbonate, 1,1,3,3-tetramethylbutyl peroxyneodecanoate, bis(4-t-butylcyclohexyl) peroxydicarbonate, 1-cyclohexyl-1-methylethyl peroxyneodecanoate, di-2-ethoxyethyl peroxydicarbonate, di-2-ethylhexyl peroxydicarbonate, t-hexyl peroxyneodecanoate, dimethoxybutyl peroxydicarbonate, di(3-methyl-3-methoxybutyl) peroxydicarbonate, t-butyl peroxyneodecanoate, 2,4-dichlorobenzoyl peroxide, t-hexyl peroxypivalate, t-butyl peroxypivalate, 3,5,5-trimethylhexanoyl peroxide, octanoyl peroxide, lauroyl peroxide, stearoyl peroxide, 1,1,3,3-tetramethylbutyl peroxy-2-ethylhexanoate, succinic peroxide, 2,5-dimethyl-2,5-di(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, m-toluoyl benzoyl peroxide, benzoyl peroxide, t-butyl peroxyisobutyrate, di-t-butylperoxy-2-methylcyclohexane, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-bis(t-butylperoxy)cyclohexane, 2,2-bis(4,4-di-t-butylperoxycyclohexyl)propane, 1,1-bis(t-butylperoxy)cyclodecane, t-hexyl peroxyisopropylmonocarbonate, t-butyl peroxymaleate, t-butyl peroxy-3,3,5-trimethylhexanoate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, 2,5-dimethyl-2,5-di(benzoylperoxy)hexane, t-butyl peroxyacetate, 2,2-bis(t-butylperoxy)butane, t-butyl peroxybenzoate, n-butyl 4,4-bis(t-butylperoxy)valerate, di-t-butyl peroxyisophthalate, α,α'-bis(t-butylperoxy)diisopropylbenzene, dicumyl peroxide, 2,5-dimethyl-2,5-di(t-butylperoxy)hexane, t-butylcumyl peroxide, di-t-butyl peroxide, p-menthane hydroperoxide, 2,5-dimethyl-2,5-di(t-butylperoxy)hexyne-3, diisopropylbenzene hydroperoxide, t-butyl trimethylsilyl peroxide, 1,1,3,3-tetramethylbutyl hydroperoxide, cumene hydroperoxide, t-hexyl hydroperoxide, and t-butyl hydroperoxide; and bibenzyl compounds such as dibenzyl, 2,3-dimethyl-2,3-diphenylbutane, α,α'-dimethoxy-α,α'-diphenylbibenzyl, α,α'-diphenyl-α-methoxybibenzyl, α,α'-diphenyl-α,α'-dimethoxybibenzyl, α,α'-dimethoxy-α,α'-dimethylbibenzyl, α,α'-dimethoxybibenzyl, 3,4-dimethyl-3,4-diphenyl-n-hexane, and 2,2,3,3-tetraphenylsuccinonitrile.

Those radical generators may be used alone or in combination of two or more thereof.

Examples of the compounds having one or more polymerizable double bonds include allyl compounds such as allylbenzene, diallylbenzene, triallylbenzene, allyloxybenzene, diallyloxybenzene, triallyloxybenzene, α,ω-diallyloxyalkanes, α,ω-diallylalkenes, α,ω-diallylalkynes, allylamine, diallylamine, triallylamine, N-allylphthalimide, N-allylpyromellitimide, N,N'-diallylurea, triallyl isocyanurate, and 2,2'-diallylbisphenol A; vinyl compounds such as styrene, divinylbenzene, trivinylbenzene, stilbene, propenylbenzene, dipropenylbenzene, tripropenylbenzene, phenyl vinyl ketone, methyl styryl ketone, α,ω-divinylalkanes, α,ω-divinylalkenes, α,ω-divinylalkynes, α,ω-divinyloxyalkanes, α,ω-divinyloxyalkenes, α,ω-divinyloxyalkynes, α,ω-diacryloyloxyalkanes, α,ω-diacryloylalkenes, α,ω-diacryloylalkynes, α,ω-dimethacryloyloxyalkanes, α,ω-dimethacryloylalkenes, α,ω-dimethacryloylalkynes, bisacryloyloxybenzene, trisacryloyloxybenzene, bismethacryloyloxybenzene, trismethacryloyloxybenzene, N-vinylphthalimide, and N-vinylpyromellitimide; and poly(arylene ether)s containing 2,2'-diallyl-4,4'-biphenol and polyarylenes containing 2,2'-diallyl-4,4'-biphenol.

Those compounds having one or more polymerizable double bonds may be used alone or in combination of two or more thereof.

Examples of the compounds having one or more polymerizable triple bonds include compounds represented by the following general formula (15) and compounds represented by the following general formula (16).

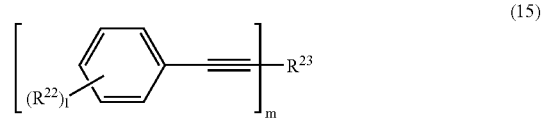

In general formulae (15) and (16), $R^{23}$ represents an aromatic group having a valence of from 2 to m; $R^{24}$ represents an aromatic group having a valence of from 2 to n; $R^{22}$ represents an alkyl group having 1 to 3 carbon atoms; l is an integer of 0 to 5; and m and n each independently represent an integer of 2 to 6.

Examples of $R^{22}$ in general formula (15), which represents an alkyl group having 1 to 3 carbon atoms, include methyl, ethyl, n-propyl, and isopropyl. Examples of $R^{23}$ in general formula (15) and $R^{24}$ in general formula (16), which represent aromatic groups respectively having valences of from 2 to m and from 2 to n, include groups represented by the following general formulae (17).

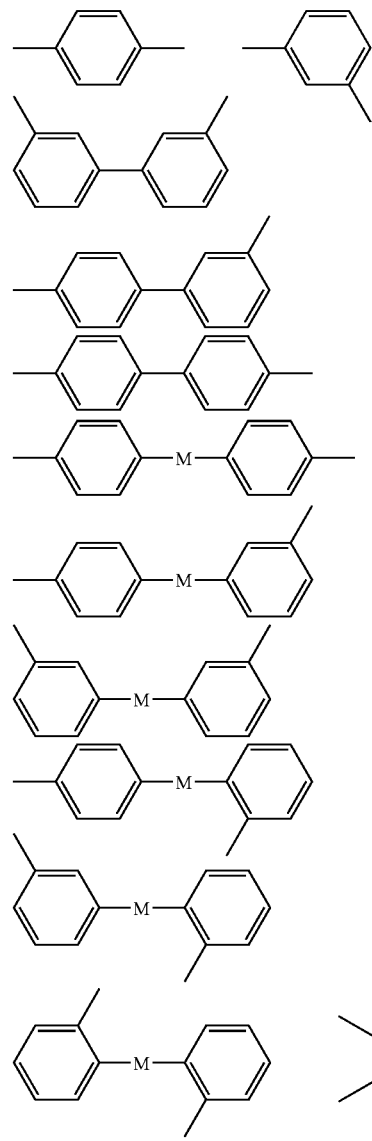

-continued
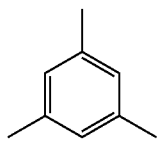 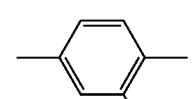
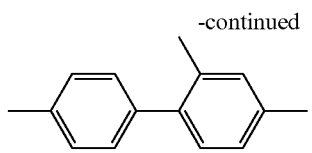
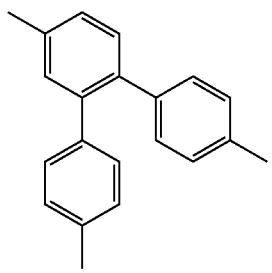
In general formulae (17), M represents at least one member selected from the group consisting of —O—, —S—, —CH$_2$—, —C(CH$_3$)$_2$—, and fluorenyl.
Specific examples of the compounds represented by general formula (15) include the compounds shown by the following formulae (18) to (29).
(18)
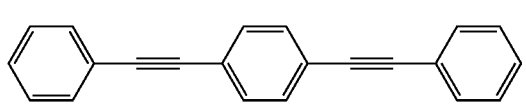
(19)
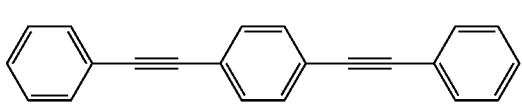
(20) (21)
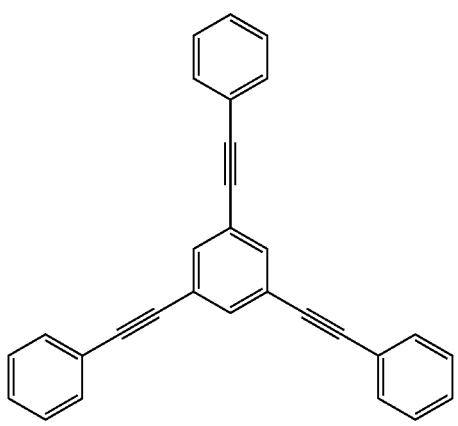
(22)
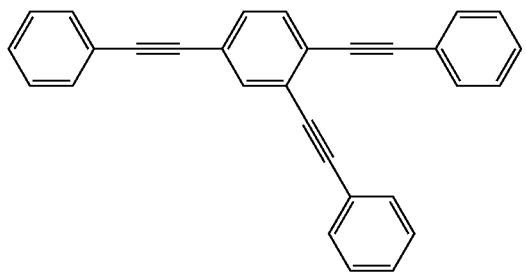
(23)
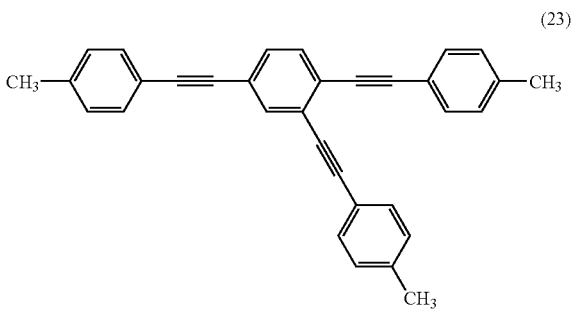

-continued
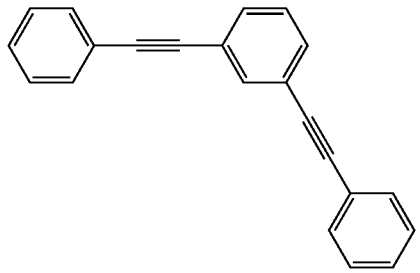 (24)
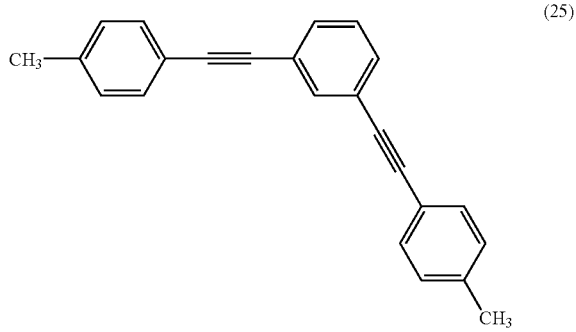 (25)
(26)
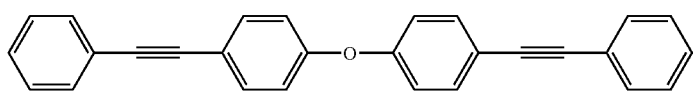
(27)
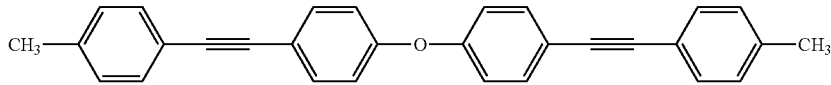
(28)
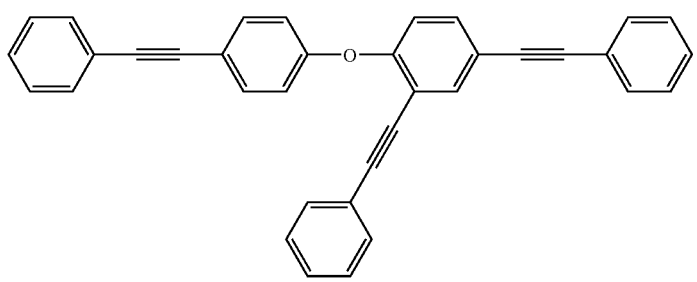
(29)
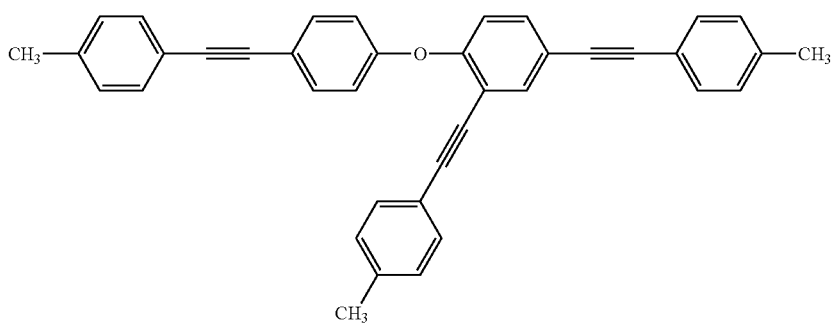
Specific examples of the compounds represented by general formula (16) include the compounds shown by the following formulae (30) to (35).
 (30)
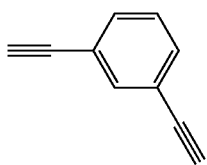 (31)
-continued
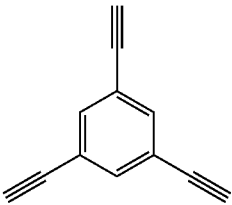 (32)
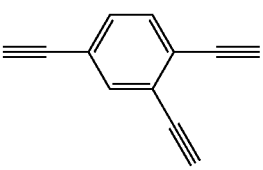 (33)

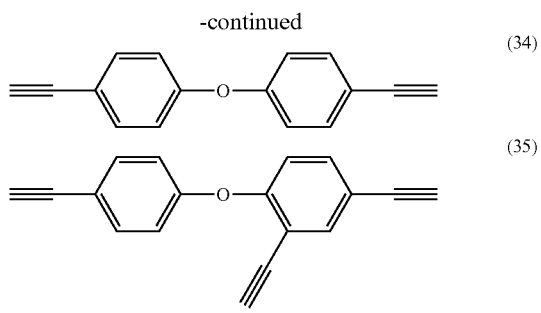

(34)

(35)

Other examples of the compounds having one or more polymerizable triple bonds include ethynylbenzene, bis(trimethylsilylethynyl)benzene, bis(trimethylsilylethynyl)benzene, tris(trimethylsilylethynyl)benzene, tris(trimethylsilylethynyl)benzene, bis(trimethylsilylethynylphenyl) ether, and trimethylsilylethynylbenzene.

Those compounds having one or more polymerizable triple bonds may be used alone or in combination of two or more thereof.

The solution to be used in the invention has a total solid concentration of preferably from 1 to 30% by weight. The concentration thereof is suitably regulated according to the intended use thereof. When the composition has a total solid concentration of from 1 to 30% by weight, the composition not only gives a coating film having an appropriate thickness but has better storage stability.

The chemical mechanical polishing stopper film thus obtained has excellent resistance to CMP treatments. Consequently, it is useful in the production of semiconductor devices such as LSIs, system LSIs, DRAMs, SDRAMs, RDRAMs, and D-RDRAMs.

An example of a method of polishing using the chemical mechanical polishing stopper film of the invention is as follows. A chemical mechanical polishing stopper film of the invention is formed on an insulting film formed on a substrate such as a silicon wafer, $SiO_2$ wafer, SiN wafer, SiC wafer, SiCO wafer, SiCN wafer, or SiCON wafer. Thereafter, an opening is formed in the films. A wiring metal is deposited thereon so as to cover the chemical mechanical polishing stopper film and fill up the opening, and the unnecessary part of the wiring metal is removed with a chemical mechanical polishing slurry.

Examples of the insulating film include inorganic insulating films such as polysiloxane films, polysilsesquioxane films, CVD-$SiO_2$ films, and carbon-doped CVD-$SiO_2$ films.

For forming a chemical mechanical polishing stopper film on the insulating film, a coating fluid comprising an organic polymer and an organic solvent is first applied by a coating means such as spin coating, dip coating, roll coating, or spraying.

This coating operation can be conducted so as to form a coating film having a thickness on a dry basis of about from 0.02 to 1.5 µm in the case of single coating or about from 0.04 to 3 µm in the case of double coating. Thereafter, the wet coating film may be dried at ordinary temperature or dried with heating at a temperature of about from 80 to 600° C. usually for about from 5 to 240 minutes. Thus, a chemical mechanical polishing stopper film can be formed. In this operation, heating can be conducted with a hot plate, oven, furnace, or the like, in the air; in a nitrogen or argon atmosphere, under vacuum, or under reduced pressure having a controlled oxygen concentration.

Irradiation with electron beams or ultraviolet also can be used for forming a chemical mechanical polishing stopper film.

Subsequently, an opening is formed in the two-layer film composed of the insulating film and the chemical mechanical polishing stopper film. A metal layer is then deposited on the chemical mechanical polishing stopper film and in the opening.

This metal layer usually is a two-layer film formed by depositing a first metal film made of a barrier metal, such as a titanium nitride (TiN) film, tantalum (Ta) film, or tantalum nitride (TaN) film, and a second metal film made of copper, an alloy containing copper-as the main component, or a copper compound.

The Figure shows an embodiment of an application of the invention, in which a metal film has been formed (a).

After the metal film formation, the unnecessary part of the metals is removed by CMP, whereby the structure shown by (b) can be obtained.

The polishing slurry with which the metal film can be removed may be any known chemical mechanical polishing slurry. Even when any polishing slurry is used, the chemical mechanical polishing stopper film of the invention can inhibit the insulating film from suffering a decrease in film thickness or scratches.

The invention will be explained below in more detail by reference to Examples. In the following Examples and Comparative Examples, all "parts" and "percents" are by weight unless otherwise indicated.

The compositions for film formation in the Examples and Comparative Examples were evaluated in the following manners.

Weight Average Molecular Weight (Mw)

Measured by gel permeation chromatography (GPC) under the following conditions.

Sample: One gram of a sample was dissolved in 100 cc of tetrahydrofuran as a solvent to prepare a sample solution.

Standard polystyrene: Standard polystyrene manufactured by Pressure Chemical, U.S.A. was used.

Apparatus: A high-performance gel permeation chromatograph for high-temperature use (Model 150-C ALC/GPC) manufactured by Waters Inc., U.S.A.

Column: SHODEX A-80M (length, 50 cm), manufactured by Showa Denko K.K.

Measuring temperature: 40° C.

Flow rate: 1 cc/min

Dielectric Constant

A composition was applied to an 8-inch silicon wafer by spin coating. The coated substrate was dried on a hot plate at 100° C. for 2 minutes and then cured in a 420° C. oven in a nitrogen atmosphere for 30 minutes. Aluminum was vapor-deposited on the resultant coated substrate to produce asubstrate fordielectricconstantevaluation. This substrate was examined with electrodes HP16451B and precision LCR meter HP4284A, both manufactured by Yokogawa-Hewlett-Packard, Ltd., and the dielectric constant thereof was calculated from the capacitance value obtained at 10 kHz.

CMP Resistance

A coating film was subjected to CMP under the following conditions.

Slurry: silica/hydrogen peroxide system

Polishing pressure: 400 g/cm$^2$

Polishing time: 180 sec

The coating film was examined for thickness change through the CMP, and the appearance of the film after the CMP was examined with a 350,000-1x lamp for surface examination. The CMP resistance of the film was evaluated-based on the following criteria.

○: Thickness change was 2% or less and no mar or peeling was observed in the film.

x: Thickness change exceeded 2%, or mars or peeling was observed in the film.

SYNTHESIS EXAMPLE 1

Into a three-necked flask were introduced 7.5 g of sodium iodide, 1.3 g of anhydrous nickel chloride, 15.7 g of triphenylphosphine, 19.6 g of a zinc powder activated with acetic acid, and 16.7 g of 9,9-bis (methylsulfonyloxy) fluorene. The contents were dried under vacuum for 24 hours. Thereafter, the atmosphere in the three-necked flask was filled with argon gas. Subsequently, 50 mL of dry N,N-dimethylacetamide, 50 mL of dry tetrahydrofuran, and 10.8 g of 2,4-dichlorotoluene were added to the contents, and the resultant mixture was stirred at 70° C. in an argon stream. As a result, the reaction mixture turned brown. This reaction mixture was further reacted at 70° C. for 20 hours and then poured into a mixture of 400 mL of 36% hydrochloric acid and 1,600 mL of methanol. The resultant precipitate was recovered.

The precipitate obtained was added to chloroform to obtain a suspension, which was extracted with 2 N aqueous hydrochloric acid solution. Thereafter, the chloroform layer was poured into methanol, and the resultant precipitate was recovered and dried. As a result, a polymer (1) having a weight-average molecular weight of 10,300 was obtained as a white powder.

In 18 g of cyclohexanone were dissolved 2 g of the polymer (1), 0.1 g of 2,3-dimethyl-2,3-diphenylbutane, and 0.2 g of 1,3,5-triethynylbenzene. This solution was filtered through a Teflon filter having an opening diameter of 0.2 μm. A coating film was formed from the solution, and examined for dielectric constant. As a result, the dielectric constant of the film was found to be 3.12.

SYNTHESIS EXAMPLE 2

Into a 1-L three-necked flask equipped with a nitrogen introduction tube and a Dean-Stark condenser were introduced 26.48 g of 9,9-bis(4-hydroxyphenyl)fluorene, 28.35 g of 9,9-bis(4-hydroxy-3-methylphenyl)fluorene, 45.60 g of anhydrous potassium carbonate, 500 mL of dimethylacetamide, and 150 mL of toluene. The resultant mixture was heated at 140° C. for 3 hours in a nitrogen atmosphere. After the water yielded by salt formation and the excess toluene were removed, the reaction mixture was cooled to room temperature. To the residual reaction mixture was added 32.73 g of 4,4'-difluorobenzophenone. This mixture was reacted at 165° C. for 10 hours. After cooling, the reaction mixture was poured into 5 L of methanol containing 10% HCl to conduct reprecipitation. The resultant precipitate was taken out by filtration, sufficiently washed with ion-exchanged water, and then predried with a vacuum oven. This precipitate was redissolved in tetrahydrofuran, and the undissolved matter was removed. The solution was poured into methanol to conduct reprecipitation. This reprecipitation operation was repeated once. The polymer was thus purified and then dried in a vacuum oven at 80° C. for 12 hours. Thus, a polymer (2) having a weight-average molecular weight of 150,000 was obtained as a white powder.

In 18 g of cyclohexanone were dissolved 2 g of the polymer (2), 0.1 g of 2,3-dimethyl-2,3-diphenylbutane, and 0.2 g of 1,3,5-triethynylbenzene. This solution was filtered through a Teflon filter having an opening diameter of 0.2 μm. A coating film was formed from the solution, and examined for dielectric constant. As a result, the dielectric constant of the film was found to be 3.24.

SYNTHESIS EXAMPLE 3

Into a 1,000-mL three-necked flask equipped with a thermometer, argon introduction tube, and stirrer were introduced 120 mL of tetrahydrofuran, 3.46 g of tetrakistriphenylphosphinepalladium, 2.1 g of dichlorobistriphenylphosphinepalladium, 1.44 g of copper iodide, 20 mL of piperidine, and 185.72 g of 4,4'-bis(2-iodophenoxy)benzophenone. There to was added 65.48 g of 4,4'-diethyldiphenyl ether. The resultant mixture was reacted at 25° C. for 20 hours. This reaction mixture was repeatedly subjected twice to reprecipitation from 5 L of acetic acid. The precipitate thus obtained was dissolved in cyclohexanone, and this solution was washed with ultrapure water twice and then subjected to reprecipitation from 5 L of methanol. The resultant precipitate was taken out by filtration-and dried to obtain a polymer (3) having a weight-average molecular weight of 35,000 as a white powder.

In 18 g of cyclohexanone was dissolved 2 g of the polymer (3). This solution was filtered through a Teflon filter having an opening diameter of 0.2 μm. A coating film was formed from the solution, and examined for dielectric constant. As a result, the dielectric constant of the film was found to be 3.19.

SYNTHESIS EXAMPLE 4

In a separable flask made of quartz, 77.04 g of methyltrimethoxysilane, 24.05 g of tetramethoxysilane, and 0.48 g of tetrakis(acetylacetonato)titanium were dissolved in 290 g of propylene glycol monopropyl ether. This solution was stirred with a Three-One Motor to keep the temperature thereof at 60° C. Subsequently, 84 g of ion-exchanged water was added to the solution over 1 hour, and the resultant mixture was reacted at 60° C. for 2 hours. Thereafter, 25 g of acetylacetone was added thereto, and this reaction mixture was reacted for further 30 minutes and then cooled to room temperature. A liquid containing methanol and water was removed in an amount of 149 g from the reaction mixture by evaporation at 50° C. Thus, a reaction mixture (1) was obtained.

The product of hydrolysis and condensation thus obtained (which was a mixture of a hydrolyzate and a condensate thereof or was either of the hydrolyzate and condensate) had a weight-average molecular weight of 8,900.

EXAMPLE 1

The reaction mixture (1) obtained in Synthesis Example 4 was applied to an 8-inch silicon wafer by spin coating. The coated substrate was dried on a hot plate at 100° C. for 1 minute and then cured in a 420° C. oven in a nitrogen atmosphere for 30 minutes to obtain a substrate A. The coating film thus formed had a thickness regulated to 500 nm.

In 18 g of cyclohexanone were dissolved 2 g of the polymer (1) obtained in Synthesis Example 1, 0.1 g of 2,3-dimethyl-2,3-diphenylbutane, and 0.2 g of 1,3,5-triethynylbenzene. This solution was filtered through a Teflon filter having an opening diameter of 0.2 μm and then applied to the substrate A by spin coating in such an amount as to result in a film thickness of 100 nm. This coated substrate was dried on a hot plate at 100° C. for 2 minutes and then cured in a 420° C. oven in a nitrogen atmosphere for 30 minutes.

This substrate was evaluated for CMP resistance. As a result, the film thickness change through the CMP was 0.5%. No mars or peeling was observed in the substrate after the CMP.

EXAMPLE 2

In 18 g of cyclohexanone were dissolved 2 g of the polymer (2) obtained in Synthesis Example 2, 0.1 g of 2,3-dimethyl-2,3-diphenylbutane, and 0.2 g of 1,3,5-triethynylbenzene. This solution was filtered through a Teflon filter having an opening diameter of 0.2 μm and then applied by spin coating to a substrate A obtained in the same manner as in Example 1, in such an amount as to result in a film thickness of 100 nm. This coated substrate was dried on a hot plate at 100° C. for 2 minutes and then cured in a 420° C. oven in a nitrogen atmosphere for 30 minutes.

This substrate was evaluated for CMP resistance. As a result, the film thickness change through the CMP was 0.8%. No mars or peeling was observed in the substrate after the CMP.

EXAMPLE 3

Commercial poly(arylene ether) solution SiLK I (trade name; manufactured by The Dow Chemical Co.) was applied by spin coating to a substrate A obtained in the same manner as in Example 1, in such an amount as to result in a film thickness of 100 nm. This coated substrate was dried on a hot plate at 100° C. for 2 minutes and then cured in a 420° C. oven in a nitrogen atmosphere for 30 minutes.

This substrate was evaluated for CMP resistance. As a result, the film thickness change through the CMP was 0.6%. No mars or peeling was observed in the substrate after the CMP.

EXAMPLE 4

Commercial poly(arylene ether) solution FLARE 2.0 (trade name; manufactured by Honeywell) was applied by spin coating to a substrate A obtained in the same manner as in Example 1, in such an amount as to result in a film thickness of 100 nm. This coated substrate was dried on a hot plate at 100° C. for 2 minutes and then cured in a 420° C. oven in a nitrogen atmosphere for 30 minutes.

This substrate was evaluated for CMP resistance. As a result, the film thickness change through the CMP was 0.7%. No mars or peeling was observed in the substrate after the CMP.

EXAMPLE 5

Evaluation was conducted in the same manner as in Example 1, except that a substrate having a CVD-TEOS film having a thickness of 500 nm was used in place of the substrate A.

This substrate was evaluated for CMP resistance. As a result, the film thickness change through the CMP was 0.7%. No mars or peeling was observed in the substrate after the CMP.

EXAMPLE 6

Evaluation was conducted in the same manner as in Example 2, except that a substrate having a Black Diamond film having a thickness of 500 nm (a carbon-doped $SiO_2$ film deposited with a CVD apparatus manufactured by Applied Materials) was used in place of the substrate A.

This substrate was evaluated for CMP resistance. As a result, the film thickness change through the CMP was 0.7%. No mars or peeling was observed in the substrate after the CMP.

EXAMPLE 7

In 18 g of cyclohexanone was dissolved 2 g of the polymer (3) obtained in Synthesis Example 3. This solution was filtered through a Teflon filter having an opening diameter of 0.2 μm and then applied by spin coating to a substrate A obtained in the same manner as in Example 1, in such an amount as to result in a film thickness of 100 nm. This coated substrate was dried on a hot plate at 100° C. for 2 minutes and then cured in a 420° C. oven in a nitrogen atmosphere for 30 minutes.

This substrate was evaluated for CMP resistance. As a result, the film thickness change through the CMP was 0.2%. No mars or peeling was observed in the substrate after the CMP.

EXAMPLE 8

Evaluation was conducted in the same manner as in Example 7, except that a substrate having a Black Diamond film having a thickness of 500 nm (a carbon-doped $SiO_2$ film deposited with a CVD apparatus manufactured by Applied Materials) was used in place of the substrate A.

This substrate was evaluated for CMP resistance. As a result, the film thickness change through the CMP was 0.2%. No mars or peeling was observed in the substrate after the CMP.

COMPARATIVE EXAMPLE 1

Evaluation was conducted in the same manner as in Example 1, except that the substrate A obtained in Example 1 was directly subjected to the CMP treatment.

As a result, the film thickness change through the CMP was 5%, and many mars were observed on the coating film after the CMP.

COMPARATIVE EXAMPLE 2

Evaluation was conducted in the same manner as in Example 1, except that the substrate A having a Black Diamond film (a carbon-doped $SiO_2$ film deposited with a CVD apparatus manufactured by Applied Materials) used in Example 6 was directly subjected to the CMP treatment.

As a result, the film thickness change through the CMP was 4%, and several mars were observed on the coating film after the CMP.

According to the invention, a coating film for semiconductors (an interlayer dielectric material) which is less damaged by CMP treatment can be provided by using the chemical mechanical polishing stopper film comprising an organic polymer having a dielectric constant of 4 or lower.

What is claimed is:

1. A chemical mechanical polishing method which comprises forming a chemical mechanical polishing stopper film comprising at least one organic polymer on an insulating film so that the stopper film is interposed between the insulating film and a metal film to be removed by chemical mechanical polishing, and then removing the metal film with a polishing fluid, wherein said stopper film has a dielectric constant of 4 or lower, and wherein said organic polymer is at least one member selected from the group consisting of polymers having repeating structural units represented by the following general formulae (1) and (2):

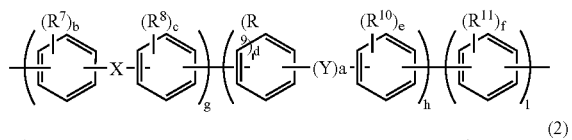

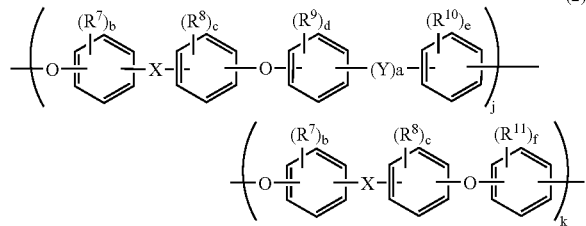

wherein $R^7$ to $R^{11}$ each independently represent a hydrocarbon group having 1 to 20 carbon atoms, a cyano group, a nitro group, an alkoxyl group having 1 to 20 carbon atoms, an aryl group, or a halogen atom; X is at least one member selected from the group consisting of groups represented by —CQQ'- (wherein Q and Q' may be the same or different and each represent a halogenoalkyl group, an alkyl group, a hydrogen atom, a halogen atom, or an aryl group) and a fluorenylene group; Y is at least one member selected from the group consisting of —O—, —CO—, —COO—, —CONH—, —S—, —SO$_2$—, and a phenylene group; a is 0 or 1; b to f each are an integer of 0 to 4; g is 5 to 100 mol %; h is 0 to 95 mol %; i is 0 to 95 mol % (provided that g+h+i=100 mol %); j is 0 to 100 mol %; and k is 0 to 100 mol % (provided that j+k =100 mol %).

2. The chemical mechanical polishing method as claimed in claim 1, wherein said metal film is composed of a first metal film comprising a barrier metal and, formed thereon, a second metal film comprising copper, an alloy containing copper as the main component, or a copper compound.

3. The chemical mechanical polishing method as claimed in claim 1, wherein said chemical mechanical polishing stopper film comprises at least one member selected from the group consisting of polyarylenes and poly(arylene ether)s.

4. A polishing method which comprises: forming on a semiconductor region a two-layer film which has an opening and is composed of an insulating film and a chemical mechanical polishing stopper film disposed on the insulating film; depositing a first metal film comprising a barrier metal and a second metal film comprising copper, an alloy containing copper as the main component, or a copper compound on the chemical mechanical polishing stopper film and in the opening to thereby fill up the opening with the deposited metal films; and removing the second metal film present over the chemical mechanical polishing stopper film with a chemical mechanical polishing fluid, wherein said stopper film has a dielectric constant of 4 or lower, and wherein said organic polymer is at least one member selected from the group consisting of polymers having repeating structural units represented by the following general formulae (1) and (2):

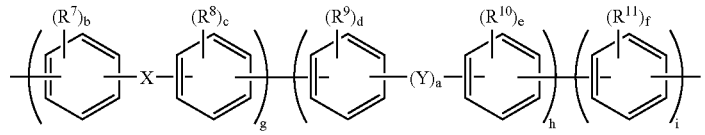

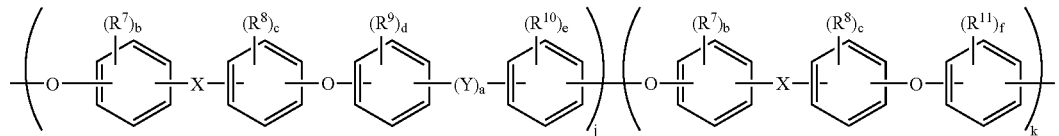

wherein $R^7$ to $R^{11}$ each independently represent a hydrocarbon group having 1 to 20 carbon atoms, a cyano group, a nitro group, an alkoxyl group having 1 to 20 carbon atoms, an aryl group, or a halogen atom; X is at least one member selected from the group consisting of groups represented by —CQQ'- (wherein Q and Q' may be the same or different and each represent a halogenoalkyl group, an alkyl group, a hydrogen atom, a halogen atom, or an aryl group) and a fluorenylene group; Y is at least one member selected from the group consisting of —O—, —CO—, —COO—, —CONH—, —S—, —SO$_2$—, and a phenylene group; a is 0 or 1; b to f each are an integer of 0 to 4; g is 5 to 100 mol %; h is 0 to 95 mol %; i is 0 to 95 mol % (provided that g+h+i=100 mol %); j is 0 to 100 mol %; and k is 0 to 100 mol% (provided that j+k =100 mol %).

* * * * *